(12) United States Patent
Shin et al.

(10) Patent No.: US 11,862,639 B2
(45) Date of Patent: Jan. 2, 2024

(54) SEMICONDUCTOR DEVICE HAVING A PLURALITY OF CHANNEL LAYERS AND METHOD OF MANUFACTURING THE SAME

(71) Applicant: SAMSUNG ELECTRONICS CO., LTD., Suwon-si (KR)

(72) Inventors: Woo Cheol Shin, Suwon-si (KR); Myung Gil Kang, Suwon-si (KR); Sadaaki Masuoka, Suwon-si (KR); Sang Hoon Lee, Suwon-si (KR); Sung Man Whang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/894,427

(22) Filed: Aug. 24, 2022

(65) Prior Publication Data

US 2022/0406779 A1 Dec. 22, 2022

Related U.S. Application Data

(60) Continuation of application No. 17/030,841, filed on Sep. 24, 2020, now Pat. No. 11,437,377, which is a (Continued)

(30) Foreign Application Priority Data

Jan. 3, 2019 (KR) ........................ 10-2019-0000559

(51) Int. Cl.
*H01L 27/092* (2006.01)
*H01L 29/66* (2006.01)
(Continued)

(52) U.S. Cl.
CPC .... *H01L 27/0924* (2013.01); *H01L 21/02532* (2013.01); *H01L 21/823807* (2013.01);
(Continued)

(58) Field of Classification Search
CPC .... H10B 12/488; H10B 12/053; H10B 12/37; H10B 12/482; H10B 12/05; H10B 12/315;
(Continued)

(56) References Cited

U.S. PATENT DOCUMENTS 8,016,941 B2 9/2011 Hierlemann et al.
9,472,555 B1 10/2016 Balakrishnan et al.
(Continued)

OTHER PUBLICATIONS

Karsenty et al. ("Modeling of the Channel Thickness Influence on Electrical Characteristics and Series Resistance inGate-Recessed Nanoscale SOI MOSFETs," Active and Passive Electronic Components, vol. 2013, pp. 1-10) (Year: 2013).

*Primary Examiner* — Yasser A Abdelaziez
(74) *Attorney, Agent, or Firm* — Muir Patent Law, PLLC

(57) ABSTRACT

A semiconductor device includes a first semiconductor layer having first and second regions, a plurality of first channel layers spaced apart from each other in a vertical direction on the first region of the first semiconductor layer, a first gate electrode surrounding the plurality of first channel layers, a plurality of second channel layers spaced apart from one another in the vertical direction on the second region of the first semiconductor layer, and a second gate electrode surrounding the plurality of second channel layers, wherein each of the plurality of first channel layers has a first crystallographic orientation, and each of the plurality of second channel layers has a second crystallographic orientation different from the first crystallographic orientation, and wherein a thickness of each of the plurality of first channel layers is different from a thickness of each of the plurality of second channel layers.

19 Claims, 19 Drawing Sheets

Related U.S. Application Data division of application No. 16/439,999, filed on Jun. 13, 2019, now Pat. No. 10,833,085.

(51) Int. Cl.

| | |
|---|---|
| *H01L 29/06* | (2006.01) |
| *H01L 29/78* | (2006.01) |
| *H01L 29/04* | (2006.01) |
| *H01L 21/02* | (2006.01) |
| *H01L 29/16* | (2006.01) |
| *H01L 21/8238* | (2006.01) |

(52) U.S. Cl.
CPC ........ *H01L 21/823821* (2013.01); *H01L 21/823828* (2013.01); *H01L 21/823864* (2013.01); *H01L 29/045* (2013.01); *H01L 29/0649* (2013.01); *H01L 29/16* (2013.01); *H01L 29/6681* (2013.01); *H01L 29/66545* (2013.01); *H01L 29/66553* (2013.01); *H01L 29/785* (2013.01)

(58) Field of Classification Search
CPC ....... H10B 12/03; H10B 12/30; H01L 21/302; H01L 29/66477
See application file for complete search history.

(56) References Cited

U.S. PATENT DOCUMENTS

| | | | |
|---|---|---|---|
| 9,691,843 | B2 | 6/2017 | Cappellani et al. |
| 9,853,114 | B1 | 12/2017 | Rodder et al. |
| 9,871,140 | B1 | 1/2018 | Balakrishnan et al. |
| 9,947,804 | B1 | 4/2018 | Frougier et al. |
| 10,008,583 | B1 | 6/2018 | Rodder et al. |
| 10,043,900 | B1 | 8/2018 | Bi et al. |
| 2005/0272231 | A1 | 12/2005 | Yun et al. |
| 2008/0023769 | A1 | 1/2008 | Shin et al. |
| 2013/0153993 | A1 | 6/2013 | Chang et al. |
| 2017/0170269 | A1 | 6/2017 | Balakrishnan et al. |
| 2017/0179128 | A1* | 6/2017 | Balakrishnan ............... H01L 21/823807 |
| 2020/0020689 | A1 | 1/2020 | Ohtou et al. |
| 2020/0066839 | A1* | 2/2020 | Zhang ............. H01L 21/823412 |

* cited by examiner

SEMICONDUCTOR DEVICE HAVING A PLURALITY OF CHANNEL LAYERS AND METHOD OF MANUFACTURING THE SAME

CROSS-REFERENCE TO RELATED APPLICATION

This application is a continuation of U.S. patent application Ser. No. 17/030,841, filed Sep. 24, 2020, which is a division of U.S. patent application Ser. No. 16/439,999, filed Jun. 13, 2019, now U.S. Pat. No. 10,833,085, which issued Nov. 10, 2022, the entire contents of each of which are hereby incorporated by reference.

Korean Patent Application No. 10-2019-0000559, filed on Jan. 3, 2019, in the Korean Intellectual Property Office, and entitled: "Semiconductor Device Having a Plurality of Channel Layers and Method of Manufacturing the Same," is incorporated by reference herein in its entirety.

BACKGROUND

1. Field

Devices and methods consistent with example embodiments relate to a semiconductor device having a plurality of channel layers and a method of manufacturing the same.

2. Description of Related Art

Along with the demand for high integration and miniaturization of semiconductor devices, sizes of transistors of the semiconductor devices are also being miniaturized. In order to prevent a short channel effect occurring due to miniaturization in size of the transistors, transistors having multi channels have been proposed. Further, there is a problem of a method of improving performance of semiconductor devices by optimizing mobility of carriers in channels.

SUMMARY

According to example embodiments, there is provided a semiconductor device including a first semiconductor layer including a first region and a second region, a plurality of first channel layers disposed to be spaced apart from one another in a vertical direction on a first region portion of the first semiconductor layer, a first gate electrode configured to surround the plurality of first channel layers, a plurality of second channel layers disposed to be spaced apart from one another in the vertical direction on a second region portion of the first semiconductor layer, and a second gate electrode configured to surround the plurality of second channel layers. The plurality of first channel layers may have first crystallographic orientations and the plurality of second channel layers may have second crystallographic orientations different from the first crystallographic orientations. A thickness of each of the plurality of first channel layers may be different from a thickness of each of the plurality of second channel layers.

According to example embodiments, there is provided a semiconductor device including a first semiconductor layer including an n-type metal oxide semiconductor (NMOS) region and a p-type metal oxide semiconductor (PMOS) region, a buried insulating layer disposed in the NMOS region of the first semiconductor layer, a second semiconductor layer disposed on the buried insulating layer, a base layer disposed in the PMOS region of the first semiconductor layer, a plurality of first channel layers including silicon and disposed to be spaced apart from one another in a vertical direction on the second semiconductor layer, a first gate electrode configured to surround the plurality of first channel layers, a plurality of second channel layers including silicon and disposed to be spaced apart from one another in the vertical direction on the base layer, and a second gate electrode configured to surround the plurality of second channel layers. The plurality of first channel layers may have first crystallographic orientations, the plurality of second channel layers may have second crystallographic orientations different from the first crystallographic orientations, and a thickness of each of the plurality of second channel layers may be smaller than a thickness of each of the plurality of first channel layers.

According to example embodiments, there is provided a method of manufacturing a semiconductor device including providing a first semiconductor layer having a first region and a second region, a buried insulating layer disposed on the first semiconductor layer, and a second semiconductor layer disposed on the buried insulating layer, forming a first stack in which a plurality of first sacrificial layers and a plurality of first channel layers are alternately stacked on the second semiconductor layer, removing the buried insulating layer, the second semiconductor layer, and a portion of the first stack on the second region using a mask pattern to expose the first semiconductor layer, forming a base layer on an exposed second region and a second stack in which a plurality of second sacrificial layers and a plurality of second channel layers are alternately stacked on the base layer, and patterning the first stack and the second stack in a fin shape. The first channel layers may have first crystallographic orientations and the second channel layers may have second crystallographic orientations different from the first crystallographic orientations.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
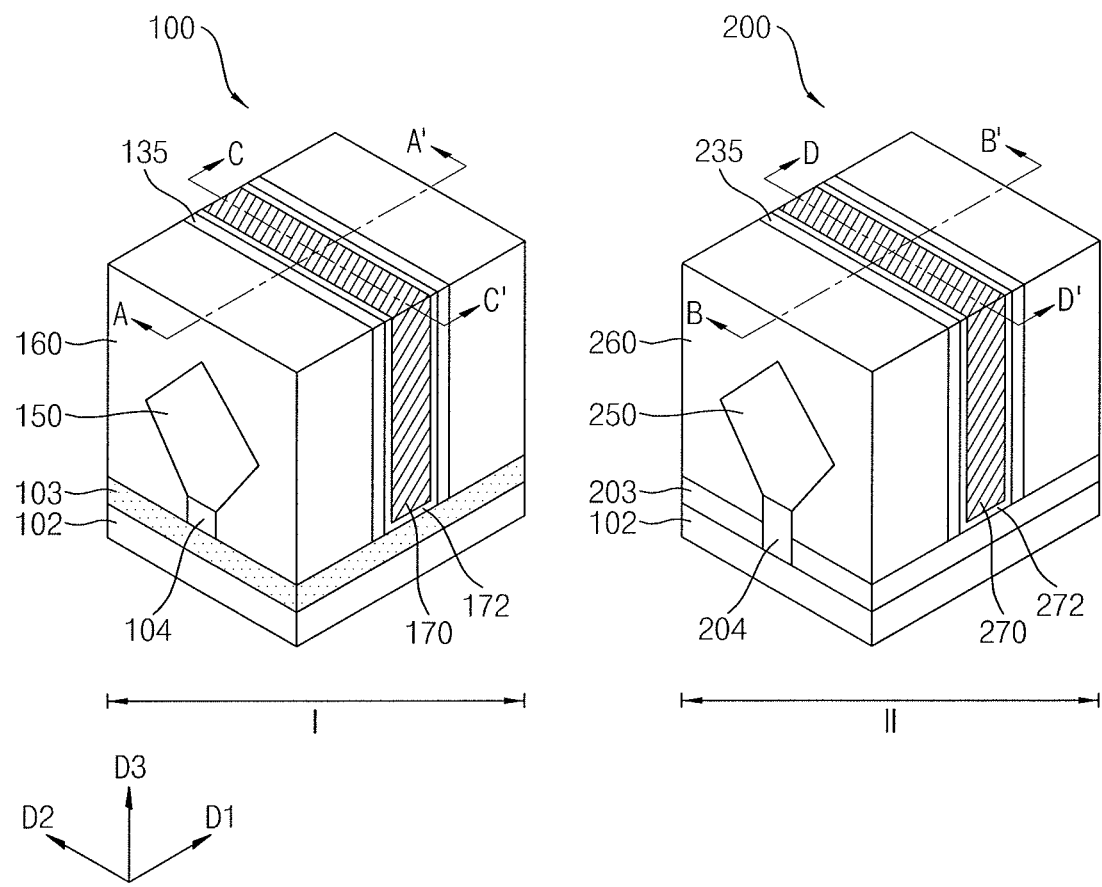
FIG. 1 illustrates perspective views of semiconductor devices according to an example embodiment.
Figure 2:
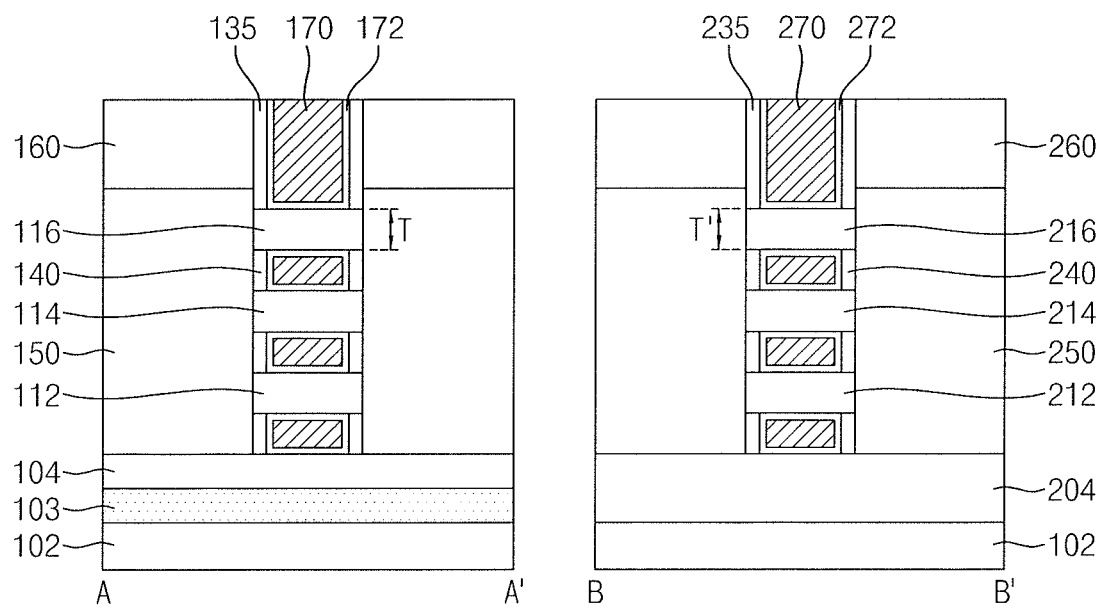
FIG. 2 illustrates vertical cross-sectional views along lines A-A' and B-B' of the semiconductor devices in FIG. 1.
Figure 3:
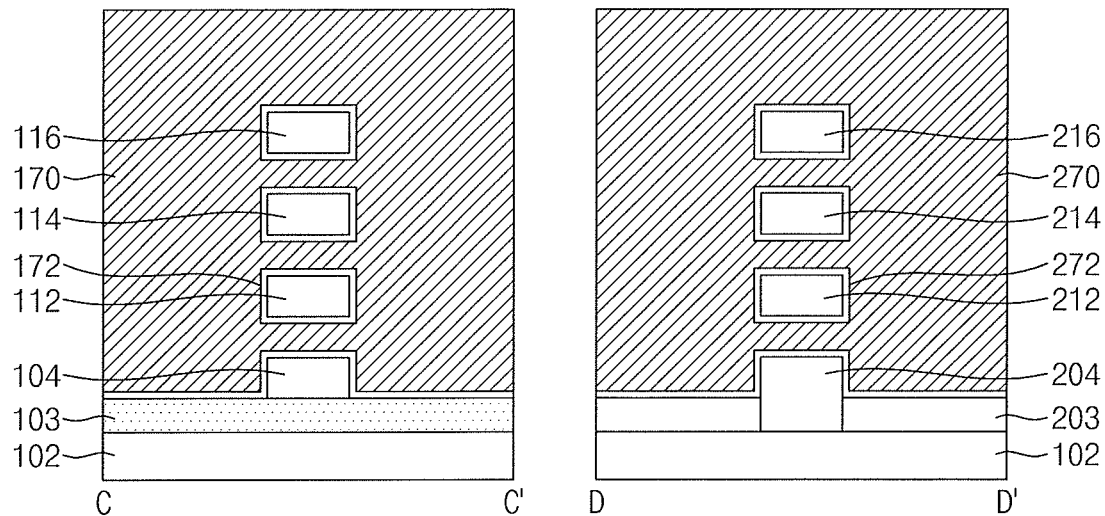
FIG. 3 illustrates vertical cross-sectional views taken along lines C-C' and D-D' of the semiconductor devices in FIG. 1.

FIG. 1 shows perspective views illustrating semiconductor devices according to an example embodiment. FIG. 2 shows vertical cross-sectional views taken along lines A-A' and B-B' of a first transistor and a second transistor, respectively, shown in FIG. 1. FIG. 3 shows vertical cross-sectional views taken along lines C-C' and D-D' of the first transistor and the second transistor, respectively, shown in FIG. 1.

The semiconductor device according to the example embodiment may include a first transistor 100 disposed in a first region I and a second transistor 200 disposed in a second region II. The semiconductor device may be a complementary metal-oxide semiconductor (CMOS) device. The first region I may be an n-type metal oxide semiconductor (NMOS) region and the second region II may be a p-type metal oxide semiconductor (PMOS) region. The first transistor 100 and the second transistor 200 may be gate-all-around field effect transistors (GAAFETs).

Referring to FIGS. 1 to 3, the first transistor 100 may include a first semiconductor layer 102, a buried insulating layer 103, a second semiconductor layer 104, first channel layers 112, 114, and 116, a gate spacer 135, a source/drain region 150, an interlayer insulating layer 160, and a gate electrode 170. The first transistor 100 may further include an inner spacer 140 and a gate dielectric layer 172.

The first semiconductor layer 102 may include, e.g., silicon. The buried insulating layer 103 and the second semiconductor layer 104 may be sequentially disposed on the first semiconductor layer 102. The first semiconductor layer 102 and the buried insulating layer 103 may be disposed on an entire surface of a lower portion of the first region I, and the second semiconductor layer 104 may be disposed to have a predetermined width in a second direction D2 and extend in a first direction D1.

The buried insulating layer 103 may include, e.g., silicon oxide. The buried insulating layer 103 may electrically insulate the first semiconductor layer 102 from the second semiconductor layer 104. In an example embodiment, the second semiconductor layer 104 may include, e.g., silicon. The first semiconductor layer 102 and the second semiconductor layer 104 may have different crystallographic orientations. For example, an upper surface of the first semiconductor layer 102, i.e., a surface of the first semiconductor layer 102 facing the buried insulating layer 103, may have a (110) orientation, and upper and lower surfaces of the second semiconductor layer 104 may each have a (100) orientation. In an example embodiment, the second semiconductor layer 104 may include a Group IV semiconductor, e.g., Ge, SiGe, or the like, or a Group III-V compound, e.g., InGaAs, InAs, GaSb, InSb, or the like.

The plurality of first channel layers 112, 114, and 116 may be disposed to be spaced apart from one other, e.g., along a third direction D3, on the second semiconductor layer 104. Each of the plurality of first channel layers 112, 114, and 116 may have a predetermined length in the first direction D1 and a predetermined width in the second direction D2. When viewed in a cross-sectional view, each of the plurality of first channel layers 112, 114, and 116 may be in a rectangular shape, and upper and lower surfaces of each thereof may be greater than a side surface of each thereof. In an example embodiment, each of the plurality of first channel layers 112, 114, and 116 may include, e.g., silicon. The plurality of first channel layers 112, 114, and 116 may each have a crystallographic orientation identical to that of the second semiconductor layer 104. For example, the upper and lower surfaces of each of the plurality of first channel layers 112, 114, and 116 may each have a (100) orientation. In an example embodiment, each of the plurality of first channel layers 112, 114, and 116 may include a Group IV semiconductor, e.g., Ge, SiGe, or the like, or a Group III-V compound, e.g., InGaAs, InAs, GaSb, InSb, or the like. For example, each of the plurality of first channel layers 112, 114, and 116 may be composed of a multiple layer of a Group III-V compound, e.g., InP/InGaAs/InAs, GaAs/InP/InAs, GaAs/InGaAs/InAs, GaAs/InAlAs/InAs, InP/InGaAs/InP, GaAs/InAs, GaAs/InGaAs, or InP/InGaAs.

The source/drain region 150 may be disposed on both, e.g., opposite, sides of each of the plurality of first channel layers 112, 114, and 116 in the first direction D1. A width of the source/drain region 150 in the second direction D2 may be formed to be greater than a width of the second semiconductor layer 104 in the second direction D2, and the source/drain region 150 may have a pentagonal cross section. The source/drain region 150 may be electrically connected to the plurality of first channel layers 112, 114, and 116. The source/drain region 150 may be formed by selective epitaxial growth (SEG) and may be doped with an impurity.

For example, when the first transistor 100 is an NMOS transistor, the source/drain region 150 may include silicon doped with an n-type impurity and may have a lattice constant that is less than that of silicon. The source/drain region 150 may improve mobility of carriers by applying tensile stress to the first channel layers 112, 114, and 116, which are channel regions.

The interlayer insulating layer 160 may be disposed on the source/drain region 150 and on an outer side of the gate electrode 170. The interlayer insulating layer 160 may entirely cover an upper surface of the buried insulating layer 103, a side surface of the second semiconductor layer 104, and the source/drain region 150. The interlayer insulating layer 160 may include, e.g., silicon oxide, silicon nitride, silicon oxynitride, or a low-k dielectric material, and may be composed of one or more layers. For example, the low-k dielectric material may include undoped silica glass (USG), borosilica glass (BSG), phosphosilica glass (PSG), borophosphosilicate glass (BPSG), plasma enhanced tetraethyl orthosilicate (PETEOS), fluoride silicate glass (FSG), a high-density plasma (HDP) oxide, or a combination thereof.

A gate structure may be disposed to extend in the second direction D2 and surround the plurality of first channel layers 112, 114, and 116. The gate dielectric layer 172 may be conformally disposed along surfaces of the buried insulating layer 103, the second semiconductor layer 104, the plurality of first channel layers 112, 114, and 116, the gate spacer 135, and the inner spacer 140. The gate dielectric layer 172 may include, e.g., a high-k dielectric material.

For example, the high-k dielectric material may include hafnium oxide, hafnium oxy-nitride, hafnium silicate, lanthanum oxide, zirconium oxide, zirconium silicate, tantalum oxide, barium strontium titanate (BST), barium titanate, strontium titanate, yttrium oxide, aluminum oxide, or a combination thereof. In an example embodiment, the gate dielectric layer 172 may include hafnium oxide ($HfO_2$).

The gate electrode 170 may be disposed on the gate dielectric layer 172. As shown in FIG. 3, in a cross-sectional view in the second direction D2, the gate electrode 170 may entirely cover the plurality of first channel layers 112, 114, and 116. The gate electrode 170 may include, e.g., aluminum, copper, titanium, tantalum, tungsten, molybdenum, tantalum nitride, nickel silicide, cobalt silicide, TiN, WN, TiAl, TiAlN, TaCN, TaC, TaSiN, a metal alloy, or a combination thereof. In an example embodiment, the gate electrode 170 may include tungsten.

An oxide layer may be disposed on the surfaces of the plurality of first channel layers 112, 114, and 116. Further, a work function adjustment layer may be included on the gate dielectric layer 172.

The gate spacers 135 may be disposed on both, e.g., opposite, sides of the gate electrode 170 in the second direction D2. The gate spacers 135 may be disposed to face each other on both sides of the gate electrode 170. The gate spacer 135 may protect the gate electrode 170. The gate spacer 135 may be composed of one or more layers. The first transistor 100 may further include a capping layer. The capping layer may be disposed on the gate spacer 135, the interlayer insulating layer 160, and the gate electrode 170.

The inner spacer 140 may be disposed on both, e.g., opposite, sides of the gate electrode 170 in the second direction D2. The inner spacer 140 may be disposed between the first channel layers 112, 114, and 116 and between the first channel layer 112 and the second semiconductor layer 104. An outer surface of the inner spacer 140 in contact with the source/drain region 150 may be coplanar with outer surfaces of the first channel layers 112, 114, and 116. A width of the inner spacer 140 in the first direction D1 may be substantially equal to a width of the gate spacer 135 in the first direction D1. The inner spacer 140 may include, e.g., silicon oxide, silicon nitride, a low-k dielectric material, or a combination thereof.

The second transistor 200 in the second region II may include a configuration similar to that of the first transistor 100. In detail, the second transistor 200 may include the first semiconductor layer 102, a device isolation layer 203, a base layer 204, a second channel layer 212, 214, and 216, a gate spacer 235, a source/drain region 250, an interlayer insulating layer 260, and a gate electrode 270. The second transistor 200 may further include an inner spacer 240 and a gate dielectric layer 272.

The device isolation layer 203 may cover a portion of the first semiconductor layer 102, and the base layer 204 may be disposed on a portion of the first semiconductor layer 102 which is not covered with the device isolation layer 203. The base layer 204 may protrude from the first semiconductor layer 102 in the third direction D3, e.g., through the device isolation layer 203. The base layer 204 may be disposed to extend in the second direction D2. A lower surface of the device isolation layer 203 may be coplanar with a lower surface of the base layer 204. An upper surface of the device isolation layer 203 may be located at a level that is lower than that of an upper surface of the base layer 204. The device isolation layer 203 may include, e.g., silicon oxide, silicon nitride, silicon oxynitride, or a low-k dielectric material. The device isolation layer 203 may be formed by, e.g., an atomic layer deposition (ALD) method, a chemical vapor deposition (CVD) method, or the like. In an example embodiment, the device isolation layer 203 may be formed by oxidizing silicon of the first semiconductor layer 102. The base layer 204 may include, e.g., silicon, and may have a crystallographic orientation identical to that of the first semiconductor layer 102. For example, upper and lower surfaces of the base layer 204 may each have a (110) orientation.

The plurality of second channel layers 212, 214, and 216 may be disposed to be spaced apart from each other, e.g., along the third direction D3, on the base layer 204. When viewed in a cross-sectional view, each of the plurality of second channel layers 212, 214, and 216 may be in a rectangular shape, and upper and lower surfaces of each thereof may be greater than a side surface of each thereof. The plurality of second channel layers 212, 214, and 216 may include, e.g., silicon, and may each have a crystallographic orientation identical to that of the first semiconductor layer 102. For example, upper and lower surfaces of the plurality of second channel layers 212, 214, and 216 may each have a (110) orientation.

The first channel layers 112, 114, and 116 may each have a thickness T in the third direction D3. The second channel layer 212, 214, and 216 may each have a thickness T' in the third direction D3. The thickness T may be formed to be substantially equal to the thickness T'.

As shown in FIGS. 2 and 3, the first channel layers 112, 114, and 116 and the second channel layers 212, 214, and 216 may each have a cross section in the form of a rectangular sheet, but embodiments are not limited thereto, e.g., these layers may each have a cross section in the form of a wire. For example, in the vertical cross section taken along line C-C' or D-D', the first channel layers 112, 114, and 116 and/or the second channel layers 212, 214, and 216 may each have a cross section in the form of a circle or an ellipse. In an example embodiment, the plurality of first channel layers 112, 114, and 116 and the plurality of second channel layers 212, 214, and 216 may each have a cross section in the form of, e.g., a trapezoid, a triangle, or a diamond of which a lower surface is greater than an upper surface.

Electrons may be used as carriers in an NMOS transistor, and holes may be used as carriers in a PMOS transistor. Electron mobility is high in silicon having a (100) orientation, whereas hole mobility is high in silicon having a (110) orientation. In the semiconductor device according to the example embodiment, the first channel layers 112, 114, and 116 and the second channel layers 212, 214, and 216 may each include silicon, the upper surfaces of the first channel layers 112, 114, and 116 may each have a (100) orientation, and the upper surfaces of the second channel layers 212, 214, and 216 may each have a (110) orientation. As described above, the crystallographic orientations of the first channel layers 112, 114, and 116 are made to be different from those of the second channel layers 212, 214, and 216, such that mobility in an NMOS transistor and a PMOS transistor may be optimized. Therefore, the semiconductor device having a high operating speed can be realized.

In an example embodiment, the first region I may correspond to a PMOS region, the second region II may correspond to an NMOS region, the upper surfaces of the plurality of first channel layers 112, 114, and 116 may each have a (110) orientation, and the upper surfaces of the plurality of second channel layers 212, 214, and 216 may each have a (100) orientation. In this case, an upper surface of the second semiconductor layer 104 has a (110) orientation, and the base layer 204 has a (100) orientation.

The source/drain region 250 may be disposed on both sides of each of the plurality of second channel layers 212, 214, and 216. When the second transistor 200 is a PMOS transistor, the source/drain regions 250 may include SiGe doped with a p-type impurity and may have a lattice constant that is greater than that of silicon. The source/drain region 250 may improve mobility of carriers by applying compressive stress to the second channel layers 212, 214, and 216.

A gate structure may include the gate electrode 270 and the gate dielectric layer 272. The gate dielectric layer 272 may be conformally disposed along surfaces of the device isolation layer 203, the base layer 204, the plurality of second channel layers 212, 214, and 216, the gate spacer 235, and the inner spacer 240. The gate electrode 270 may be disposed on the gate dielectric layer 272.

Figure 4:
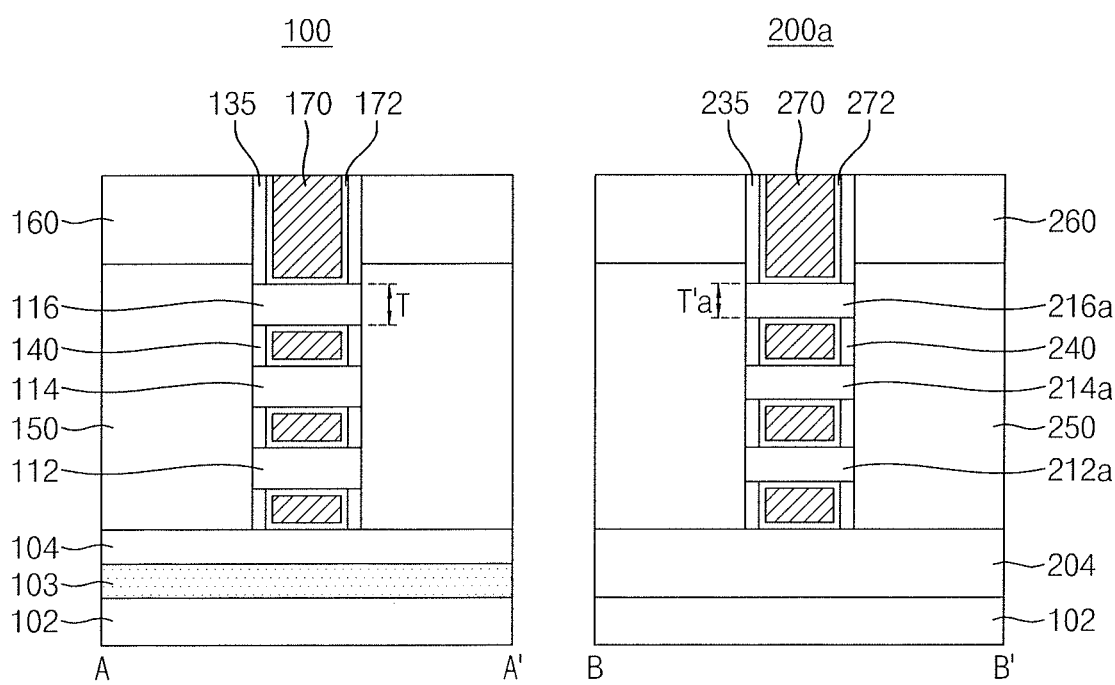
FIGS. 4 and 5 illustrate vertical cross-sectional views taken along lines A-A' and B-B' and lines C-C' and D-D', respectively, according to an example embodiment.
Figure 5:
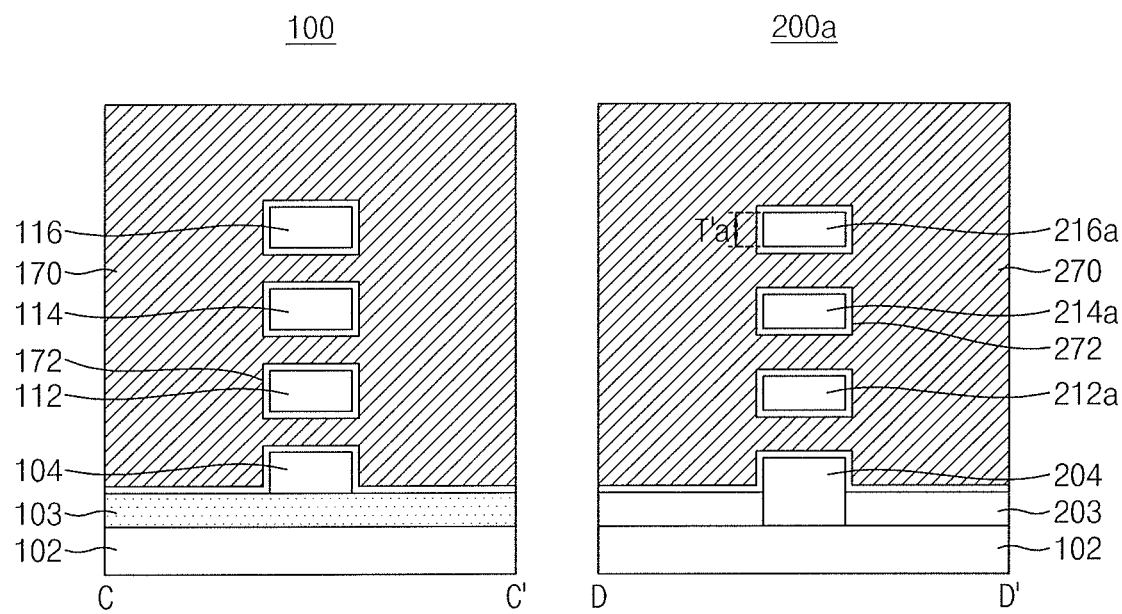

FIGS. 4 and 5 show cross-sectional views of a semiconductor device according to an example embodiment. FIG. 4 shows vertical cross-sectional views taken along the lines A-A' and B-B' of a first transistor and a second transistor, respectively, according to an example embodiment, which correspond to the vertical cross-sectional views of FIG. 2. FIG. 5 shows vertical cross-sectionals views taken along the lines C-C' and D-D' of the first transistor and the second transistor, respectively, according to an example embodiment, which correspond to the vertical cross-sectional views of FIG. 3.

Referring to FIGS. 4 and 5, a second transistor 200a may include a plurality of second channel layers 212a, 214a, and 216a. The second channel layers 212a, 214a, and 216a may each have a thickness T'a in the third direction D3. As described below, the first channel layers 112, 114, and 116 and the second channel layers 212a, 214a, and 216a are formed by different processes and thus may be formed to have different thicknesses. For example, the thickness T'a of each of the second channel layers 212a, 214a, and 216a may be formed to be smaller than a thickness T of each of the first channel layers 112, 114, and 116. A gap between the second channel layers 212a, 214a, and 216a may be formed to be greater than a gap between the first channel layers 112, 114, and 116.

Generally, when a channel layer is short, a current leakage between source/drain regions may occur even when a voltage is not applied to a metal gate. As shown in FIGS. 4 and 5, the second transistor 200a includes the second channel layers 212a, 214a, and 216a, each having a relatively small thickness T'a such that a problem of a leakage current occurring between the source/drain regions 250 may be prevented.

Figure 6:
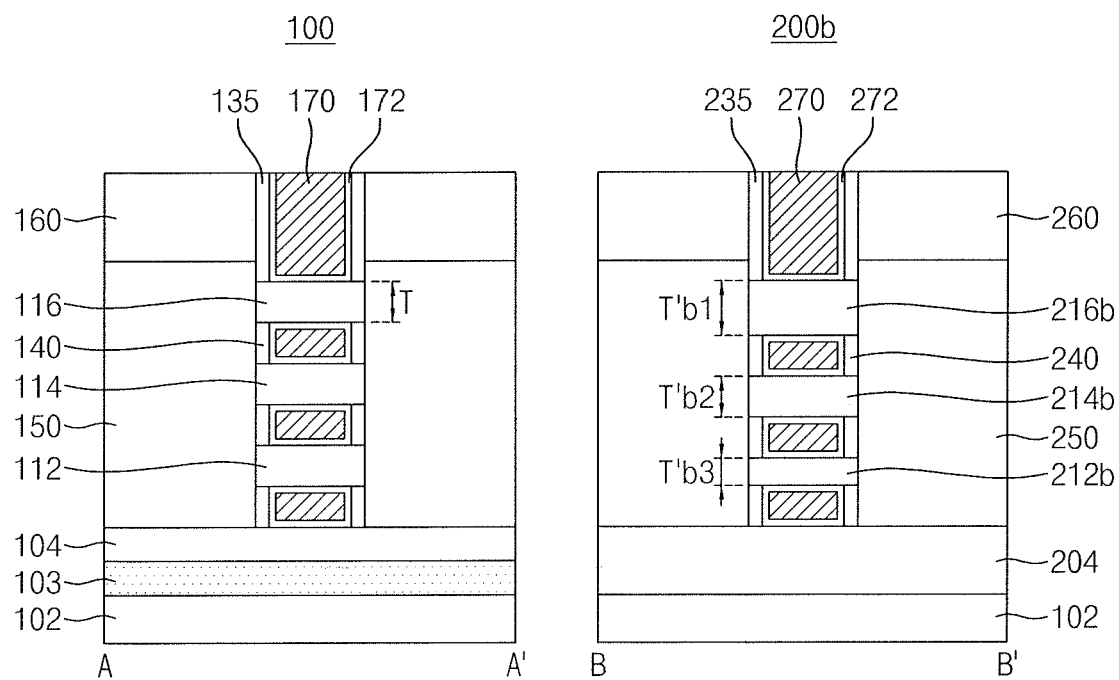
FIGS. 6 and 7 illustrate vertical cross-sectional views taken along lines A-A' and B-B' and lines C-C' and D-D', respectively, according to an example embodiment.
Figure 7:
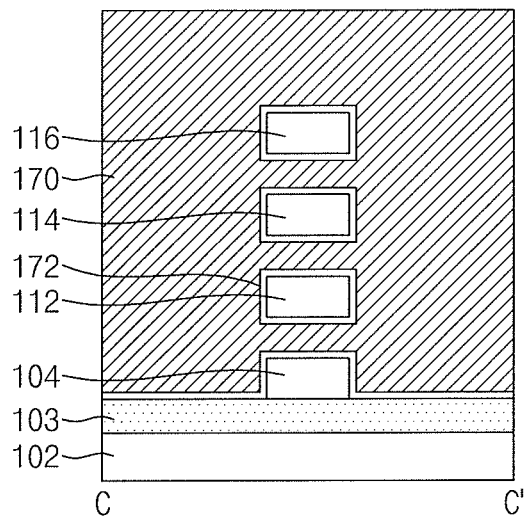
Figure 7:
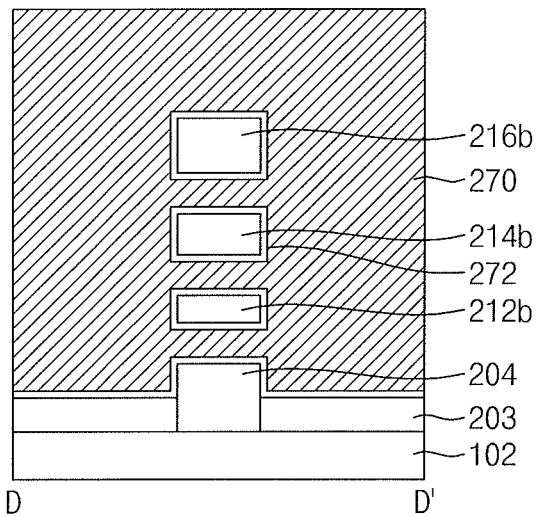

FIGS. 6 and 7 show cross-sectional views of a semiconductor device according to an example embodiment. FIG. 6 shows vertical cross-sectional views taken along the lines A-A' and B-B' of a first transistor and a second transistor, respectively, according to an example embodiment, which correspond to the vertical cross-sectional views of FIG. 2. FIG. 7 shows vertical cross-sectional views taken along the lines C-C' and D-D' of the first transistor and the second transistor, respectively, according to an example embodiment, which correspond to the vertical cross-sectional views of FIG. 3.

Referring to FIGS. 6 and 7, a second transistor 200b may include a plurality of second channel layers 212b, 214b, and 216b. The second channel layer 212b may have a thickness T'b3, the second channel layer 214b may have a thickness T'b2, and the second channel layer 216b may have a thickness T'b1. The thicknesses T'b3, T'b2, and T'b1 of the second channel layers 212b, 214b, and 216b may be formed to be different from one another. For example, the second channel layer 214b may be formed to be thinner than the second channel layer 216b and formed to be thicker than the second channel layer 212b.

Figure 8:
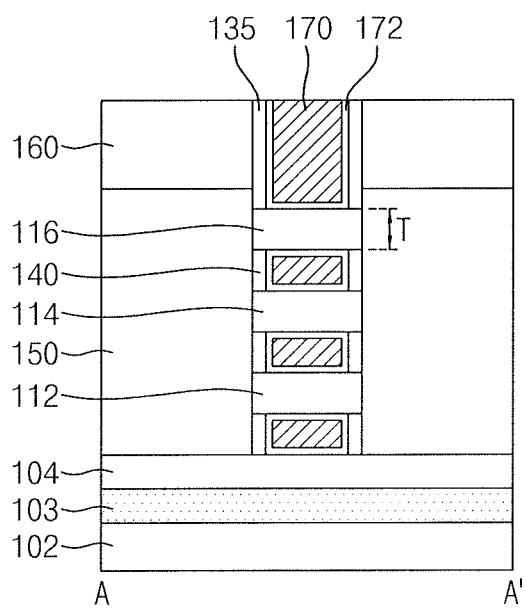
FIGS. 8 and 9 illustrate vertical cross-sectional views taken along lines A-A' and B-B' and lines C-C' and D-D', respectively, according to an example embodiment.
Figure 8:
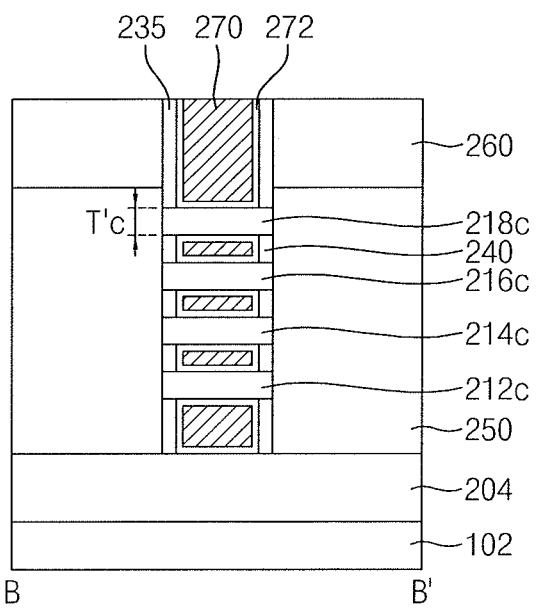
Figure 9:
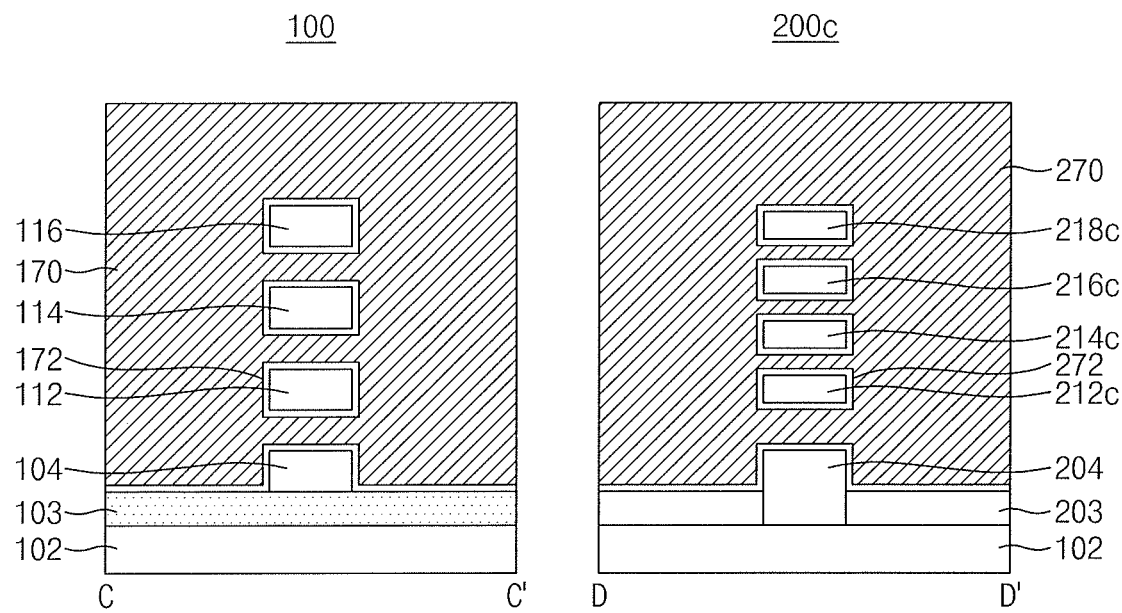

FIGS. 8 and 9 show cross-sectional views of a semiconductor device according to an example embodiment. FIG. 8 shows vertical cross-sectional views taken along the lines A-A' and B-B' of a first transistor and a second transistor, respectively, according to an example embodiment, which correspond to the vertical cross-sectional views of FIG. 2. FIG. 9 shows vertical cross-sectional views taken along the lines C-C' and D-D' of the first transistor and the second transistor, respectively, according to an example embodiment, which correspond to the vertical cross-sectional views of FIG. 3.

Referring to FIGS. 8 and 9, the first transistor 100 and a second transistor 200c may have different numbers of channels. In an example embodiment, the first transistor 100 may include three first channel layers 112, 114, and 116, and the second transistor 200c may include four second channel layers 212c, 214c, 216c, and 218c. A thickness T'c of each of the second channel layers 212c, 214c, 216c, and 218c may be formed to be smaller than the thickness T of each of the first channel layers 112, 114, and 116. The second channel layers 212c, 214c, 216c, and 218c may have the same thickness T'c, but embodiments are not limited thereto. Referring to FIGS. 8 and 9, the second transistor 200c includes the second channel layers 212c, 214c, 216c, and 216a, each having a relatively small thickness T'c such that a short channel effect and channel resistance may be complemented.

Figure 10:
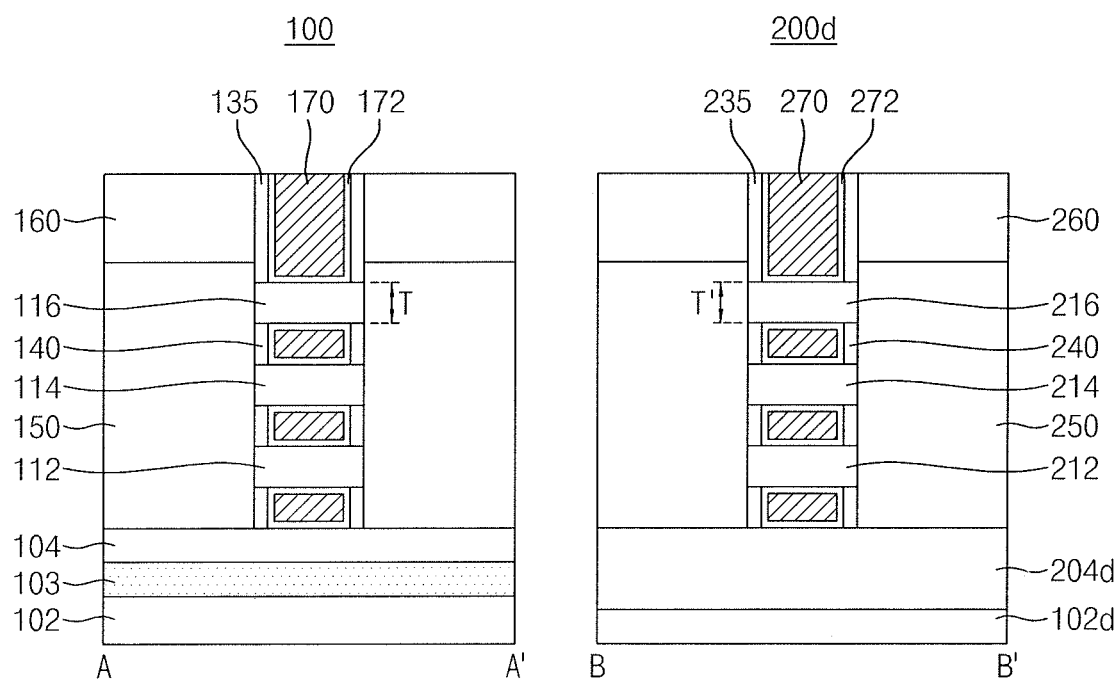
FIGS. 10 and 11 illustrate vertical cross-sectional views taken along lines A-A' and B-B' and lines C-C' and D-D', respectively, according to an example embodiment.
Figure 11:
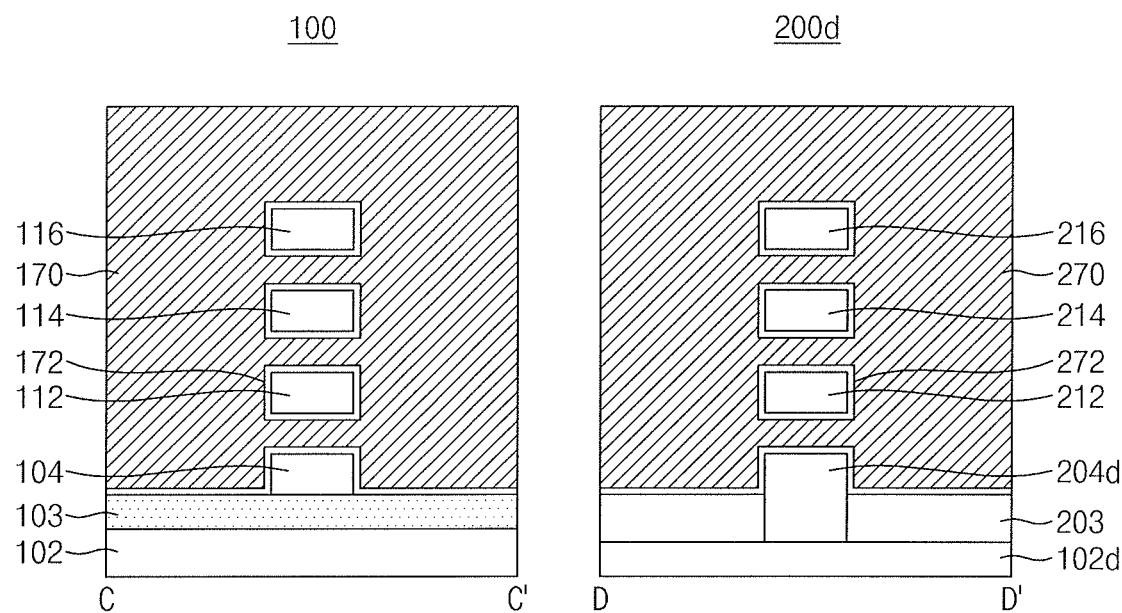

FIGS. 10 and 11 show cross-sectional views of a semiconductor device according to an example embodiment. FIG. 10 shows vertical cross-sectional views taken along the lines A-A' and B-B' of a first transistor and a second transistor, respectively, according to an example embodiment, which correspond to the vertical cross-sectional views of FIG. 2. FIG. 11 shows vertical cross-sectional views taken along the lines C-C' and D-D' of the first transistor and the second transistor, respectively, according to an example embodiment, which correspond to the vertical cross-sectional views of FIG. 3.

Referring to FIGS. 10 and 11, an upper surface of the first semiconductor layer 102 at a lower portion of the first transistor 100 may be located at a level different from that of an upper surface of a first semiconductor layer 102d at a lower portion of a second transistor 200d. For example, the upper surface of the first semiconductor layer 102d may be located at a level that is lower than that of the upper surface of the first semiconductor layer 102. In a process which will be described below, a second region II of the first semiconductor layer 102 may be partially etched to form the first semiconductor layer 102d. The thickness T may be formed to be substantially identical to the thickness T', but embodiments are not limited thereto.

Figure 12:
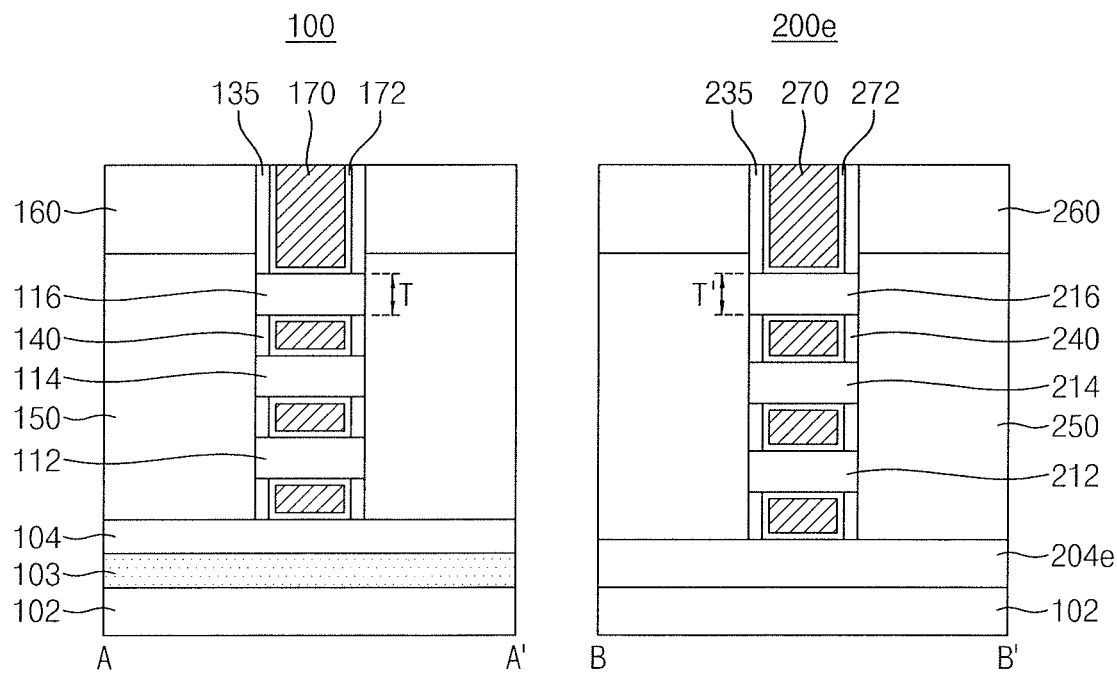
FIGS. 12 and 13 illustrate vertical cross-sectional views taken along lines A-A' and B-B' and lines C-C' and D-D', respectively, according to an example embodiment.
Figure 13:
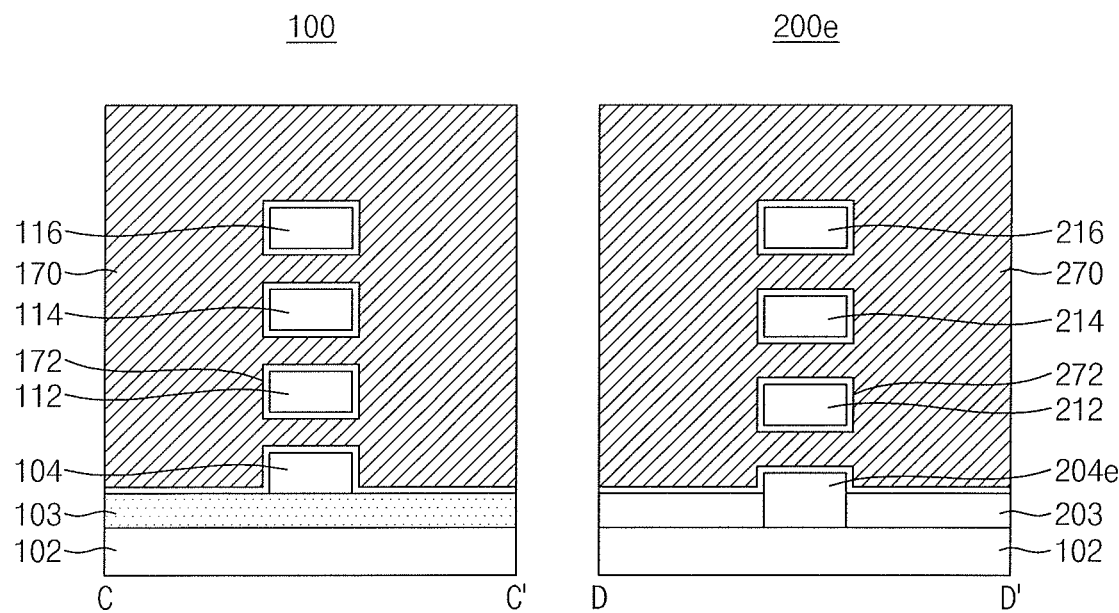

FIGS. 12 and 13 show cross-sectional views of a semiconductor device according to an example embodiment. FIG. 12 shows vertical cross-sectional views taken along the lines A-A' and B-B' of a first transistor and a second transistor, respectively, according to an example embodiment, which correspond to the vertical cross-sectional views of FIG. 2. FIG. 13 shows vertical cross-sectional views taken along the lines C-C' and D-D' of the first transistor and the second transistor, respectively, according to an example embodiment, which correspond to the vertical cross-sectional views of FIG. 3.

Referring to FIGS. 12 and 13, the upper surface of the second semiconductor layer 104 may be located at a level different from that of an upper surface of a base layer 204e. For example, the upper surface of the base layer 204e may be located at a level that is lower than that of the upper surface of the second semiconductor layer 104. In an example embodiment, the upper surface of the base layer 204e may be located at a level that is higher than that of the upper surface of the second semiconductor layer 104. The thickness T may be formed to be substantially identical to the thickness T', but embodiments are not limited thereto.

FIGS. 14 to 20 are cross-sectional views, which are illustrated according to the order of processes, for describing a method of manufacturing a first stack 110 and a second stack 210 according to an example embodiment.

Figure 14:
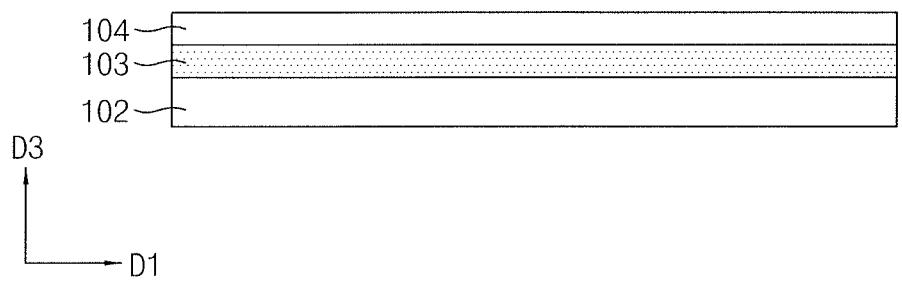
FIGS. 14 to 20 illustrate cross-sectional views of stages in a method of manufacturing a first stack and a second stack according to an example embodiment.

Referring to FIG. 14, the first semiconductor layer 102, the buried insulating layer 103, and the second semiconductor layer 104 may be provided. For example, the first semiconductor layer 102, the buried insulating layer 103, and the second semiconductor layer 104 may be a silicon on insulator (SOI) substrate. For example, the SOI substrate may be formed by bonding a substrate, e.g., the first semiconductor layer 102, on another substrate having an oxide film thereon, e.g., the second semiconductor layer 104 with the buried insulating layer 103 thereon, so a structure of the buried insulating layer 103 sandwiched between the first and second semiconductor layers 102 and 104 may be formed. In an example embodiment, the first semiconductor layer 102 and the second semiconductor layer 104 may include silicon, while the silicon in the first semiconductor layer 102 and the second semiconductor layer 104 may have different crystallographic orientations. For example, an upper surface of the first semiconductor layer 102 may have a (110) orientation and an upper surface of the second semiconductor layer 104 may have a (100) orientation. In an example embodiment, the first semiconductor layer 102 and/or the second semiconductor layer 104 may include a Group IV semiconductor, e.g., Ge, SiGe, or the like, or a Group compound, e.g., InGaAs, InAs, GaSb, InSb, or the like.

Figure 15:
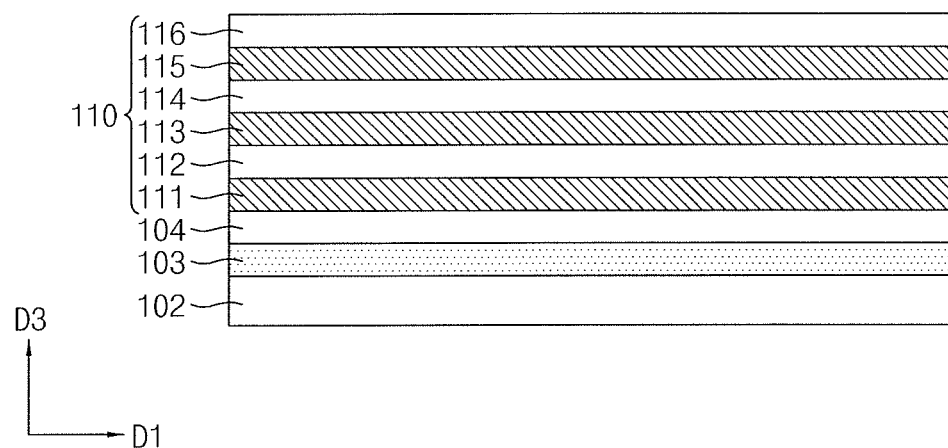

Referring to FIG. 15, the first stack 110 may be formed on the second semiconductor layer 104. The first stack 110 may have a structure in which a plurality of sacrificial layers 111, 113, and 115 and the plurality of first channel layers 112, 114, and 116 are alternately stacked. The plurality of sacrificial layers 111, 113, and 115 and the plurality of first channel layers 112, 114, and 116 may be formed by epitaxial growth with the second semiconductor layer 104 as a seed layer. The plurality of sacrificial layers 111, 113, and 115 may include materials having an etch selectivity with respect to the plurality of first channel layers 112, 114, and 116. In an example embodiment, the plurality of sacrificial layers 111, 113, and 115 may include, e.g., SiGe, and the plurality of first channel layers 112, 114, and 116 may include Si. The plurality of first channel layers 112, 114, and 116 may each have a crystallographic orientation identical to that of the second semiconductor layer 104, e.g., since grown from the second semiconductor layer 104. For example, the upper and lower surfaces of each of the plurality of first channel layers 112, 114, and 116 may each have a (100) orientation. In an example embodiment, the plurality of sacrificial layers 111, 113, and 115 and/or the plurality of first channel layers 112, 114, and 116 may include a Group IV semiconductor, e.g., Si, Ge, SiGe, or the like, or a Group III-V compound.

Figure 16:
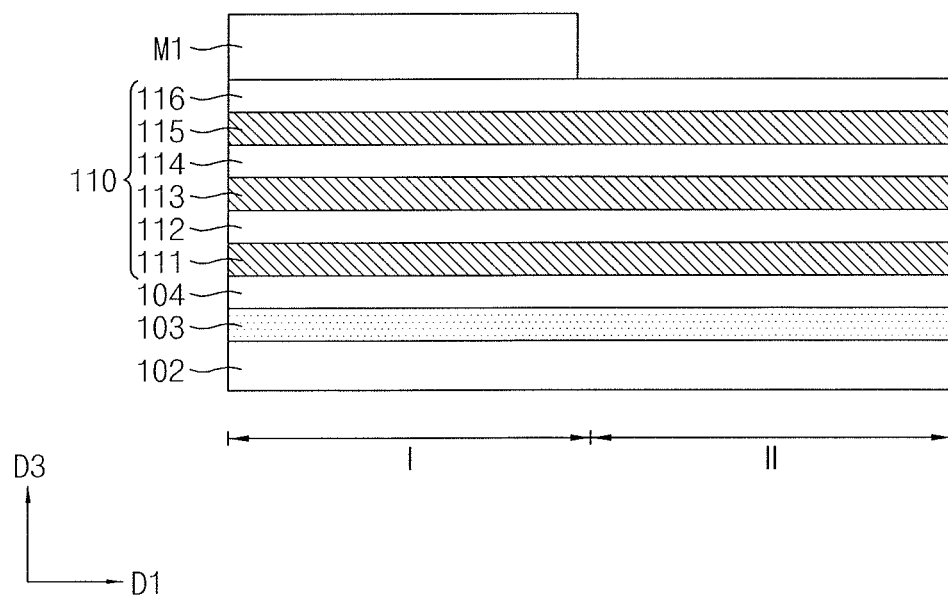

Referring to FIG. 16, a mask pattern M1 may be disposed on the first stack 110. For example, the mask pattern M1 may be disposed in the first region I and may not be disposed in the second region II.

Figure 17:
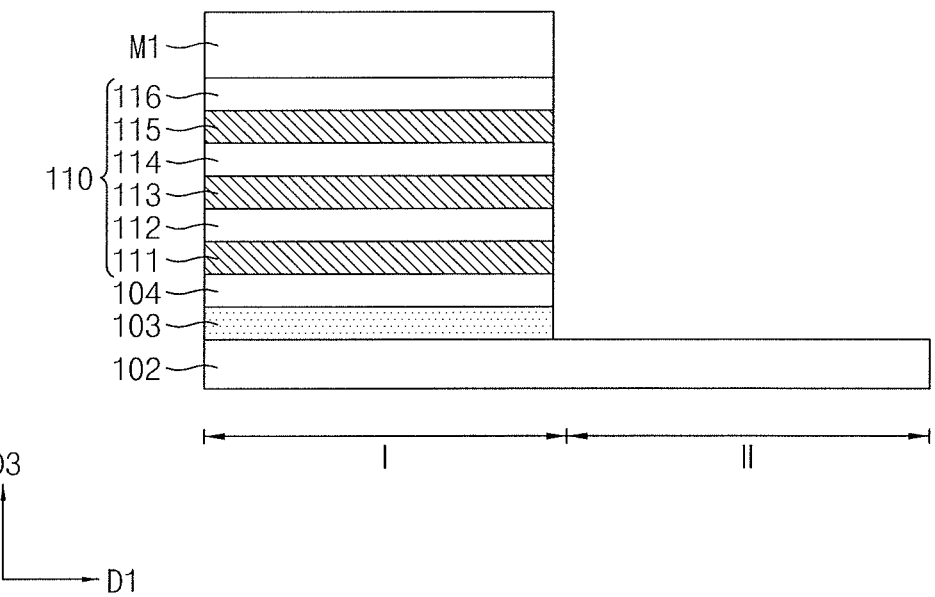
Figure 18:
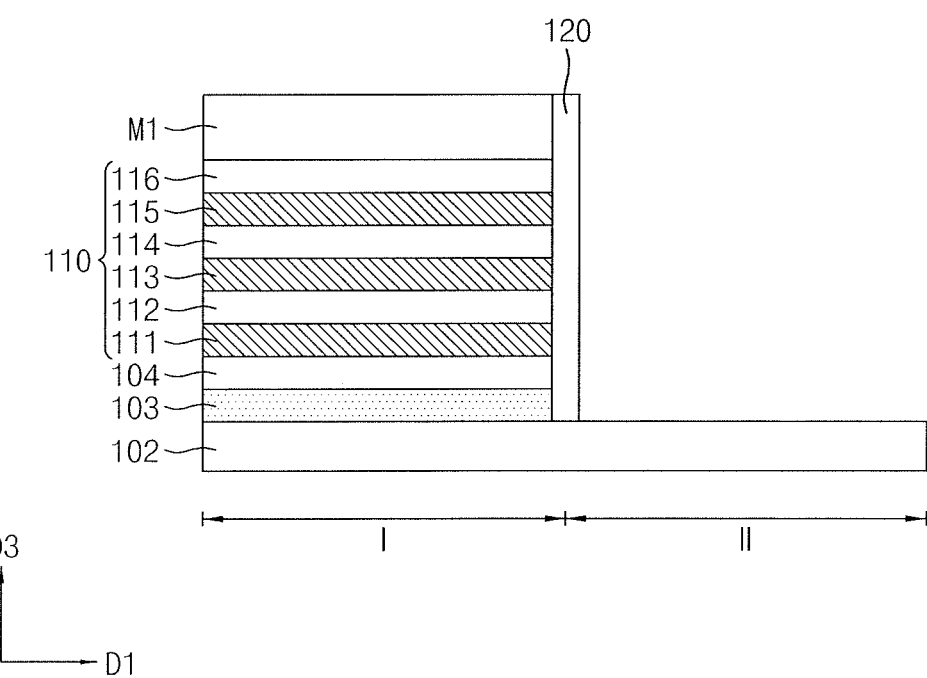

Referring to FIG. 17, a portion of the first stack 110 in the second region II, which is exposed by the mask pattern M1, may be removed. The buried insulating layer 103 and the second semiconductor layer 104 in the second region II may be etched to expose the first semiconductor layer 102. In FIG. 18, the upper surface of the first semiconductor layer 102 in the first region I and the upper surface of the first semiconductor layer 102 in the second region II have been shown as being located at the same level, but embodiments are not limited thereto. In an example embodiment, the first semiconductor layer 102 in the second region II may be over-etched, and thus the upper surface of the first semiconductor layer 102 in the second region II may be located at a level that is lower than that of the upper surface of the first semiconductor layer 102 in the first region I.

Referring to FIG. 18, a liner 120 may be formed on a side surface of the first stack 110 in the first direction D1. The liner 120 may be disposed at a boundary between the first region I and the second region II. The liner 120 may be formed such that the insulating layer is formed on the resultant structure of FIG. 15 by CVD or ALD, and then, when anisotropic etching is performed, the insulating layer remains on only the side surface of the first stack 110.

Figure 19:
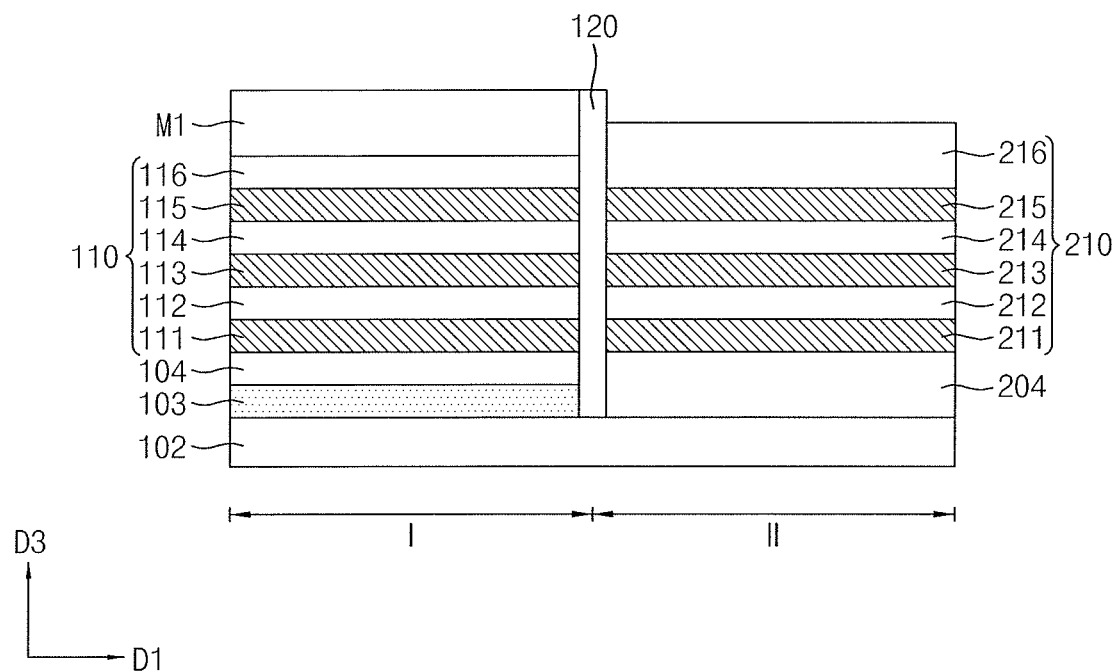

Referring to FIG. 19, the base layer 204 and the second stack 210 disposed on the base layer 204 may be formed on a portion of the exposed first semiconductor layer 102. The base layer 204 and the second stack 210 may be disposed in the second region II. The second stack 210 may have a structure in which a plurality of sacrificial layers 211, 213, and 215 and the plurality of second channel layers 212, 214, and 216 are alternately stacked. The base layer 204, the plurality of sacrificial layers 211, 213, and 215, and the plurality of second channel layers 212, 214, and 216 may be formed by epitaxial growth with the first semiconductor layer 102 as a seed layer. The plurality of sacrificial layers 211, 213, and 215 may include materials having an etch selectivity with respect to the plurality of second channel layers 212, 214, and 216. In an example embodiment, the plurality of sacrificial layers 211, 213, and 215 may include SiGe, and the base layer 204 and the plurality of second channel layers 212, 214, and 216 may include Si. The base layer 204 and the plurality of second channel layers 212, 214, and 216 may have crystallographic orientations identical to the crystallographic orientation of the first semiconductor layer 102, e.g., since grown from the first semiconductor layer 102. For example, the upper and lower surfaces of each of the plurality of second channel layers 212, 214, and 216 may each have a (110) orientation. In an example embodiment, the base layer 204 and/or the plurality of second channel layers 212, 214, and 216 may include a Group IV semiconductor, e.g., Si, Ge, SiGe, and the like, or a Group compound. Each of the plurality of second channel layers 212, 214, and 216 may be composed of a multiple layer.

Figure 20:
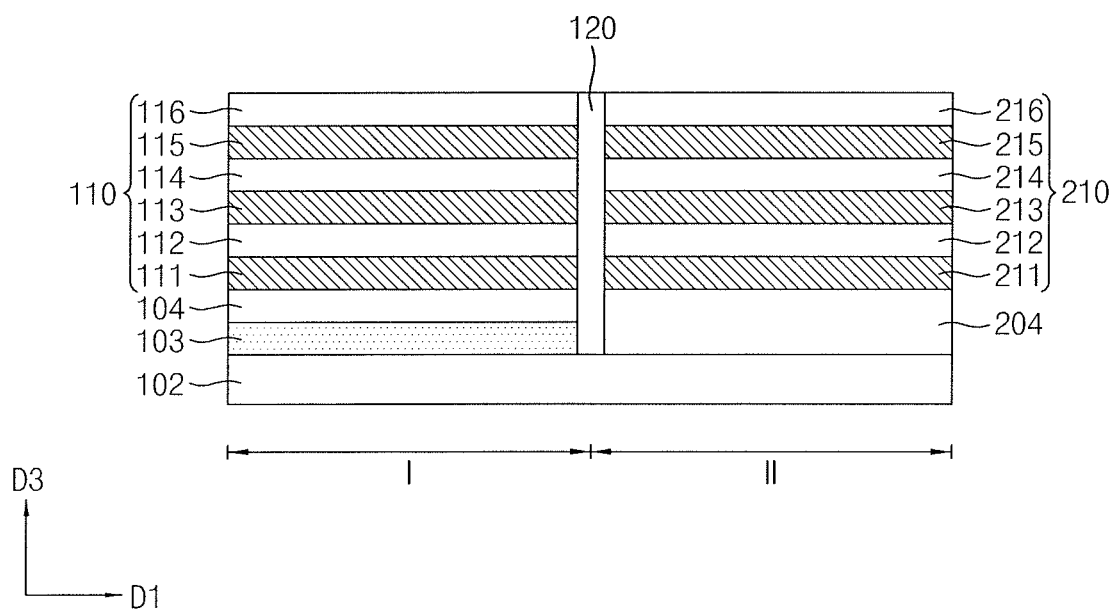

Referring to FIG. 20, the mask pattern M1 may be removed, and the liner 120 may be partially etched. The first channel layers 112, 114, and 116 and the second channel layers 212, 214, and 216 may also be partially etched.

As shown in FIGS. 14 to 20, the first stack 110 and the second stack 210 may be formed by separate processes. In an example embodiment, the first stack 110 may be formed first and, subsequently, the second stack 210 may be formed on the first semiconductor layer 102 exposed by removing a portion of the first stack 110. The upper surfaces of the first channel layers 112, 114, and 116 and the upper surfaces of the second channel layers 212, 214, and 216 may be located at the same level.

In FIG. 20, the plurality of sacrificial layers 111, 113, 115, 211, 213, and 215, the first channel layers 112, 114, and 116, and the second channel layers 212, 214, and 216 have been shown as having the same thickness, but embodiments are not limited thereto. In an example embodiment, the plurality of sacrificial layers 111, 113, and 115 may be formed to be thicker than the plurality of first channel layers 112, 114, and 116. The plurality of sacrificial layers 211, 213, and 215 may be formed to be thicker than the plurality of second channel layers 212, 214, and 216.

FIGS. 14 to 20 show that the first semiconductor layer 102 including silicon has a (110) orientation and the second semiconductor layer 104 has a (100) orientation. However, embodiments are not limited thereto. In an example embodiment, the first semiconductor layer 102 including silicon may have a (100) orientation and the second semiconductor layer 104 may have a (110) orientation. In this case, each of the first channel layers 112, 114, and 116 may have a (110) orientation identical to the (110) orientation of the second semiconductor layer 104, and the second channel layers 212, 214, and 216 may each have a (100) orientation identical to the (100) orientation of the first semiconductor layer 102.

Since the first stack 110 and the second stack 210 are formed by separate processes, the first stack 110 and the second stack 210 may have different structures. In an example embodiment, the plurality of second channel layers 212, 214, and 216 may be formed to be thinner than the plurality of first channel layers 112, 114, and 116. A thickness of each of the plurality of sacrificial layers 211, 213, and 215 may be formed to be greater than the thickness of each of the plurality of sacrificial layers 111, 113, and 115. In an example embodiment, the plurality of second channel layers 212, 214, and 216 may have different thicknesses. Alternatively, the plurality of first channel layers 112, 114, and 116 may have different thicknesses. The thicknesses of the plurality of first channel layers 112, 114, and 116, the second channel layers 212, 214, and 216, and the sacrificial layers 111, 113, 115, 211, 213, and 215 may be adjusted in the third direction D3, which is a vertical direction, such that it is possible to form a transistor having various characteristics without changing the existing design rule.

FIGS. 21 to 23, 24A, 25A, 26A, 27A, 28A, 29A, 30A, and 31 show perspective views and a cross-sectional view, which are illustrated according to the order of processes, for describing a method of manufacturing a semiconductor device according to an example embodiment. FIGS. 24B, 25B, 26B, 27B, 28B, 29B, and 30B are vertical cross-sectional views taken along lines A-A' and B-B' in FIGS. 24A, 25A, 26A, 27A, 28A, 29A, and 30A.

Figure 21:
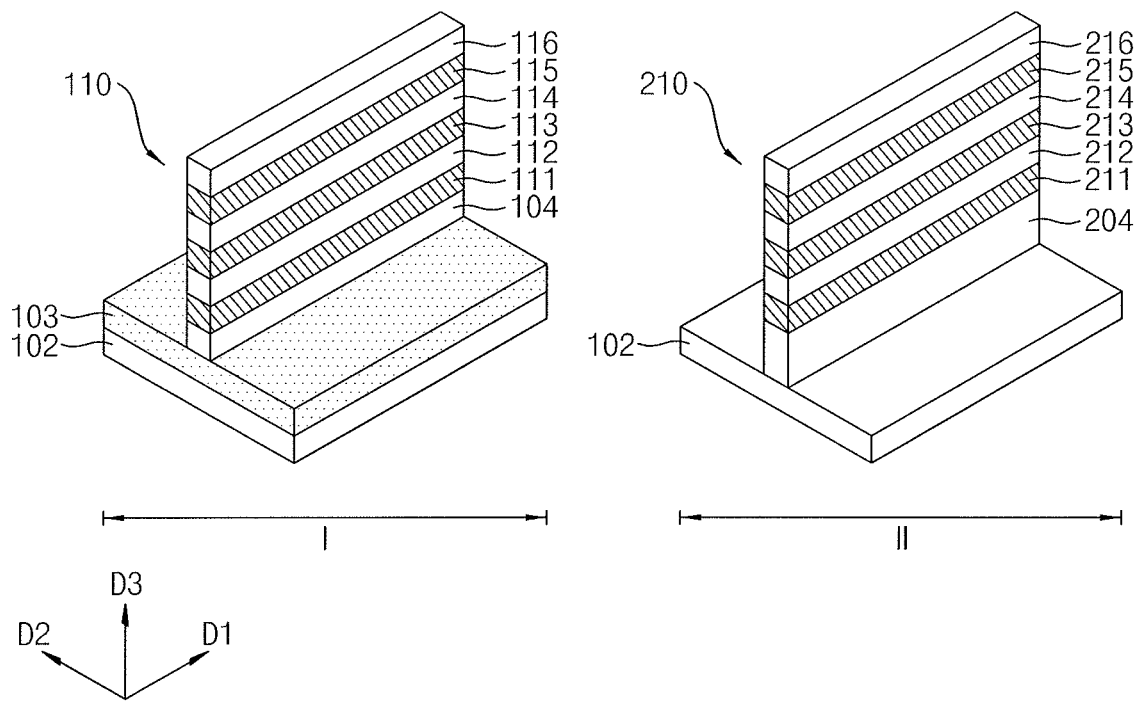
FIGS. 21 to 31 illustrate perspective views and cross-sectional views of stages in a method of manufacturing a semiconductor device according to an example embodiment.

Referring to FIG. 21, the first stack 110 and the second stack 210 may be patterned in fin shapes. The buried insulating layer 103 of the first region I and the first semiconductor layer 102 of the second region II may be exposed. The first semiconductor layer 102 and the buried insulating layer 103 may not be etched. The base layer 204 may have a pattern identical to that of the second stack 210.

The first stack 110, the base layer 204, and the second stack 210, which are patterned, may have shapes protruding from the first semiconductor layer 102 in the third direction D3. The first stack 110, the base layer 204, and the second stack 210, which are patterned, may extend in the first direction D. In FIG. 21, widths of the first stack 110, the base layer 204, and the second stack 210, which are patterned, have been shown as being constant in the second direction D2, but embodiments are not limited thereto. In an example embodiment, the patterned first stack 110 and the patterned base layer 204 may have shapes increasing in width downward in the second direction D2. The patterned second stack 210 may also have a shape increasing in width downward in the second direction D2.

Figure 22:
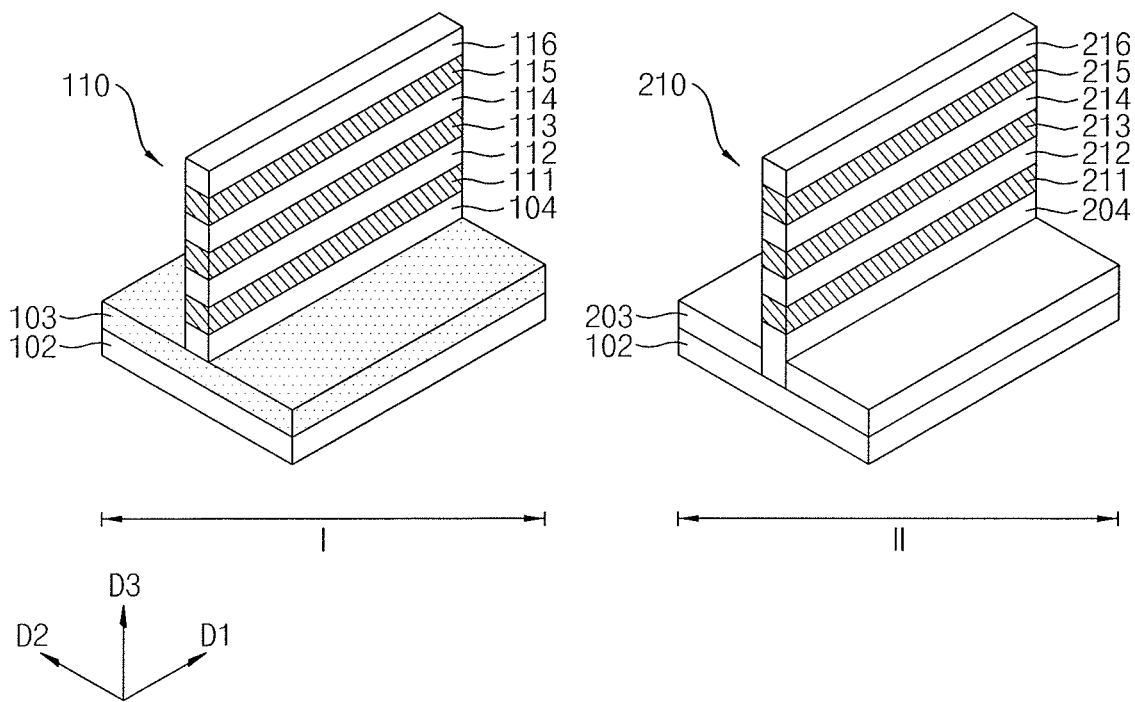

Referring to FIG. 22, the device isolation layer 203 may be formed on the first semiconductor layer 102 in the second region II. The device isolation layer 203 may partially cover the upper surface of the first semiconductor layer 102 and the side surface of the base layer 204 in the second region II. The device isolation layer 203 may include, e.g., silicon oxide, silicon nitride, silicon oxynitride, or a low-k dielectric material.

Figure 23:
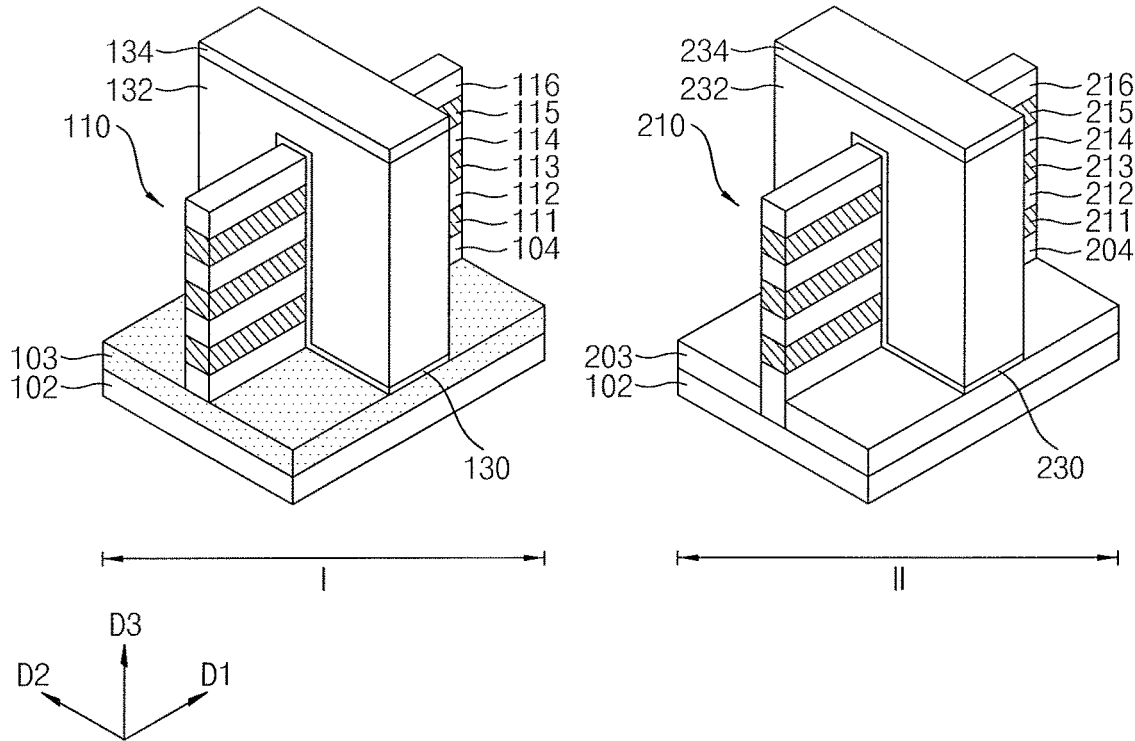

Referring to FIG. 23, a dummy gate structure may be formed on each of the first stack 110 and the second stack 210. The dummy gate structure may include dummy gate insulating layers 130 and 230, dummy gate electrodes 132 and 232, and dummy capping layers 134 and 234. The dummy gate structure may be disposed to straddle each of the first stack 110 and the second stack 210 and may further extend in the second direction D2. The dummy gate structures may cover a side surface and an upper surface of each of the first stack 110 and the second stack 210.

The dummy gate insulating layers 130 and 230, the dummy gate electrodes 132 and 232, and the dummy capping layers 134 and 234 may be stacked sequentially. The dummy gate insulating layers 130 and 230 may include silicon oxide and may be formed by, e.g., a CVD method, an ALD method, or the like. The dummy gate electrodes 132 and 232 may include, e.g., polysilicon. The dummy capping layers 134 and 234 may be formed of, e.g., silicon nitride, silicon oxynitride, or a combination thereof.

Figure 24A:
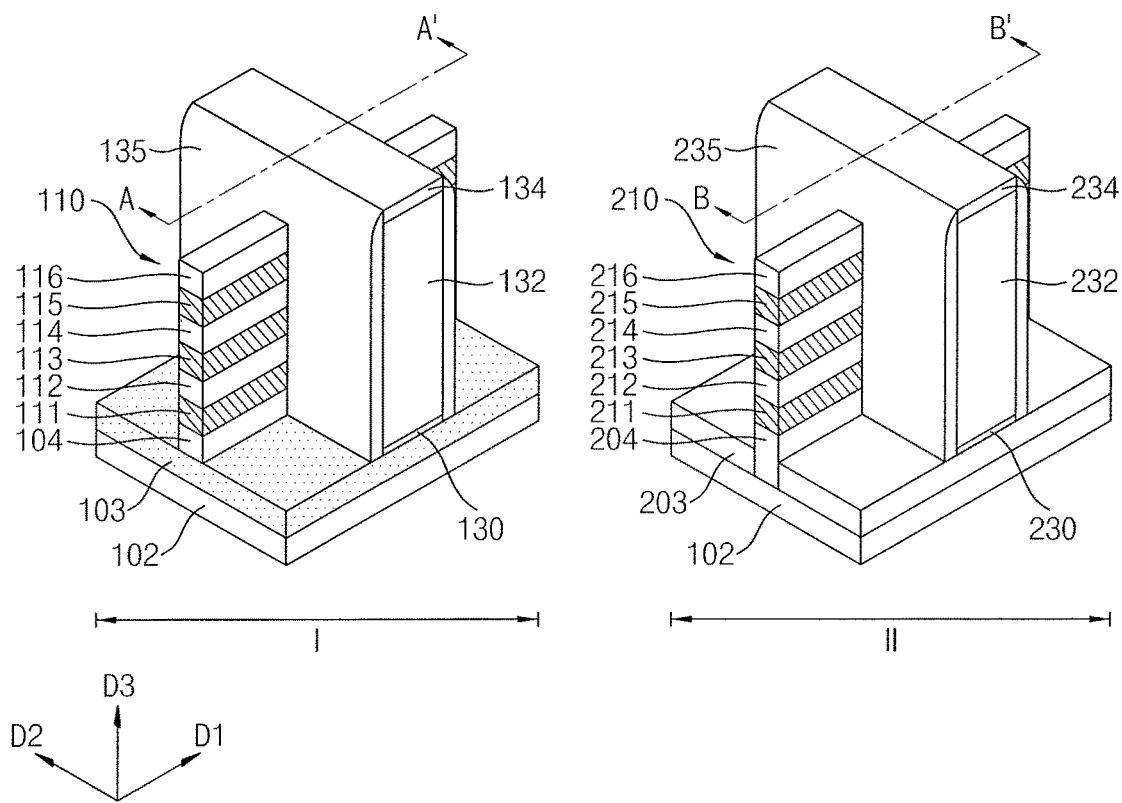
Figure 24B:
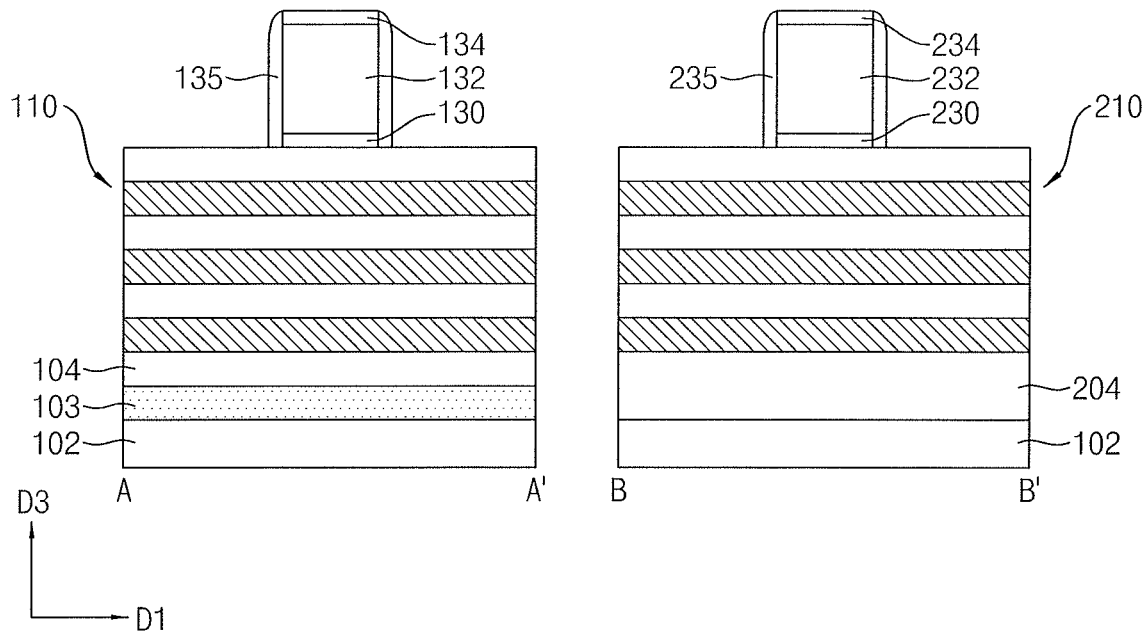

Referring to FIGS. 24A and 24B, the gate spacers 135 or 235 may be formed on the side surfaces of the dummy gate structure. The gate spacers 135 or 235 may be disposed to face each other on both sides of the dummy gate electrode 132 or 232 in the first direction D1. The gate spacers 135 and 235 may not be removed during a subsequent etching process to protect the gate electrodes 170 and 270.

Each of the gate spacers 135 and 235 may be constituted of one or more layers and may include, e.g., silicon nitride, silicon oxynitride, or a combination thereof. The gate spacers 135 and 235 may not cover upper surfaces of the dummy capping layers 134 and 234.

Figure 25A:
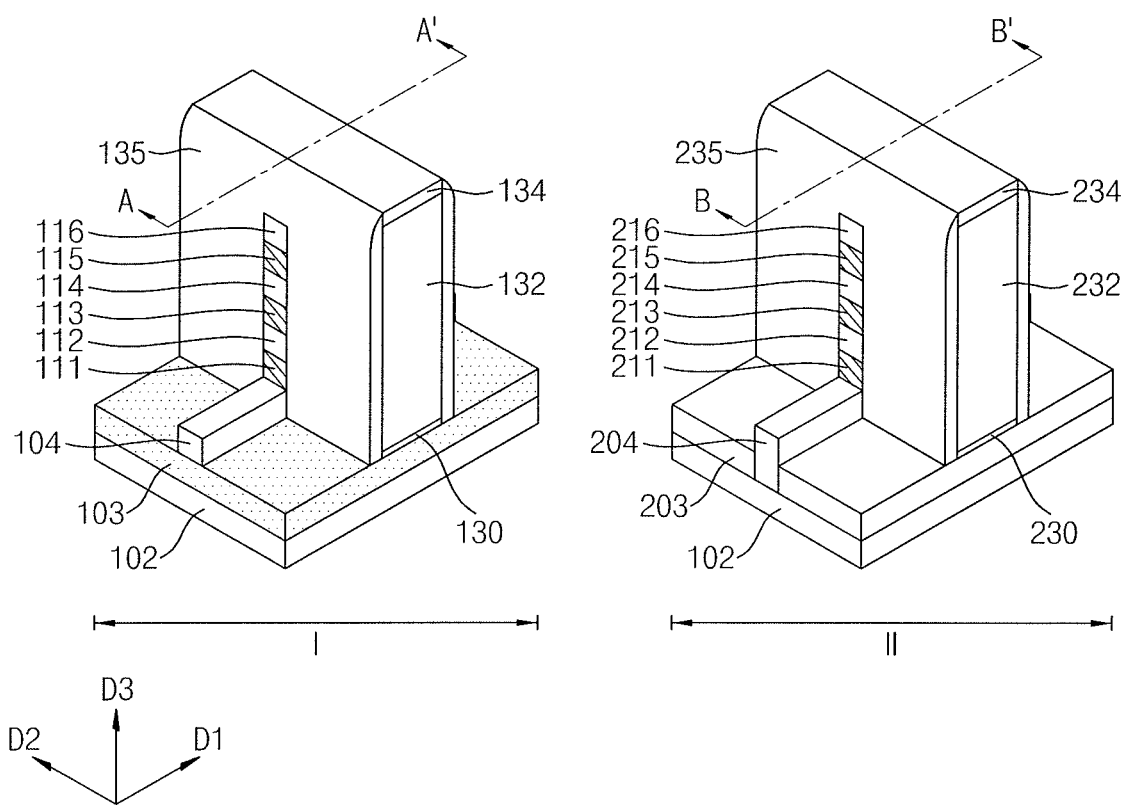
Figure 25B:
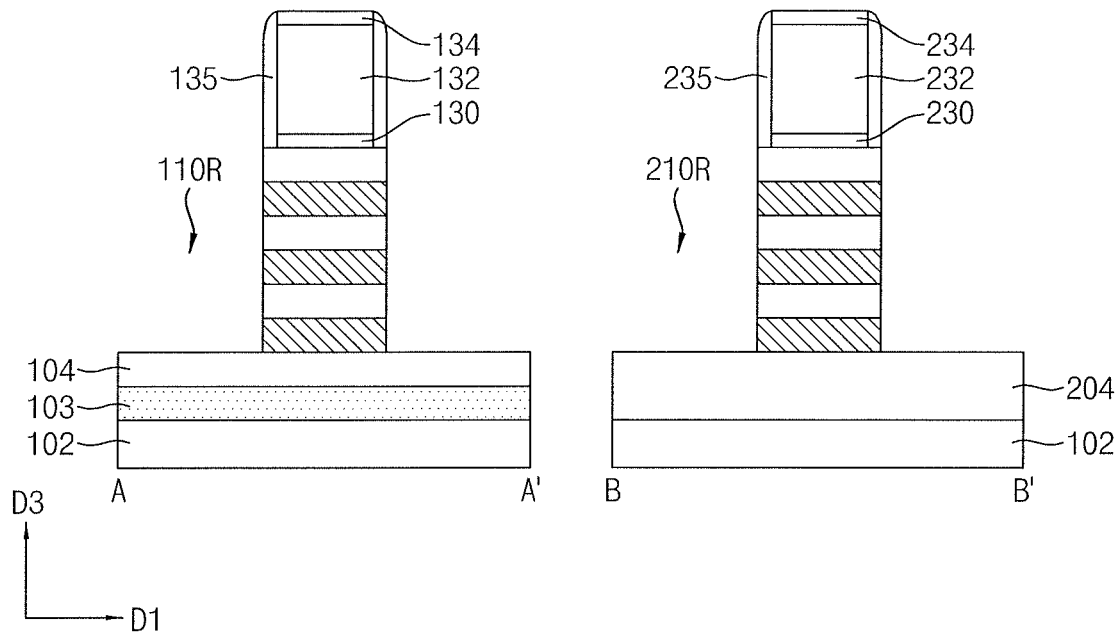

Referring to FIGS. 25A and 25B, a portion of the first stack 110 not covered with the dummy gate electrode 132 and a portion of the second stack 210 not covered with the dummy gate electrode 232 may be etched. For example, exposed upper portions of the first stack 110 and the second stack 210 may be partially removed to form recesses 110R and 210R. The side surfaces of the sacrificial layers 111, 113, 115, 211, 213, and 215, the first channel layers 112, 114, and 116, and the second channel layers 212, 214, and 216 may be exposed by the recesses 110R and 210R. In an example embodiment, portions of the second semiconductor layer 104 and the base layer 204 may not be etched. In an example embodiment, a portion of the second semiconductor layer 104 located outside the gate spacer 135 and a portion of the base layer 204 located outside the gate spacer 135 may be partially or entirely removed.

Figure 26A:
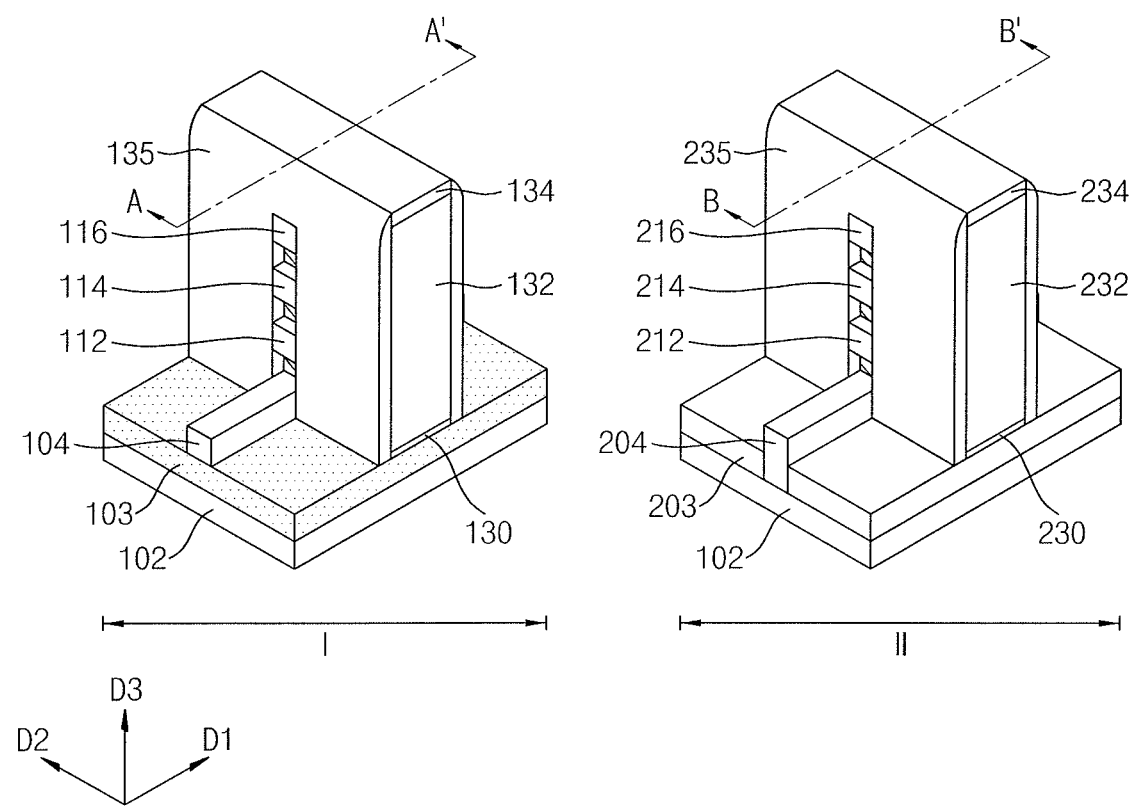
Figure 26B:
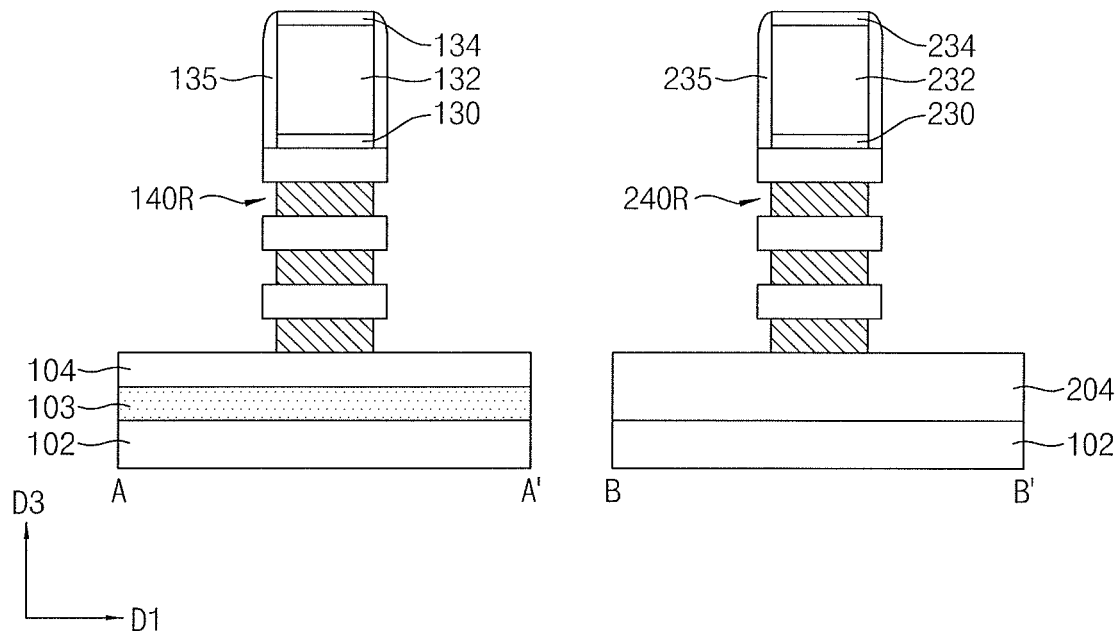

Referring to FIGS. 26A and 26B, outer sides of the sacrificial layers 111, 113, 115, 211, 213, and 215 exposed by the recesses 110R and 210R may be partially etched to form a plurality of recesses 140R and 240R. The plurality of recesses 140R and 240R may have trench or dimple shapes, and the sacrificial layers 111, 113, 115, 211, 213, and 215 may not be entirely removed. A width of the recess 140R or 240R may be substantially equal to a width of the gate spacer 135 or 235. The first channel layers 112, 114, and 116 and the second channel layers 212, 214, and 216, which have an etch selectivity with respect to the plurality of sacrificial layers 111, 113, 115, 211, 213, and 215, may not be etched.

Figure 27A:
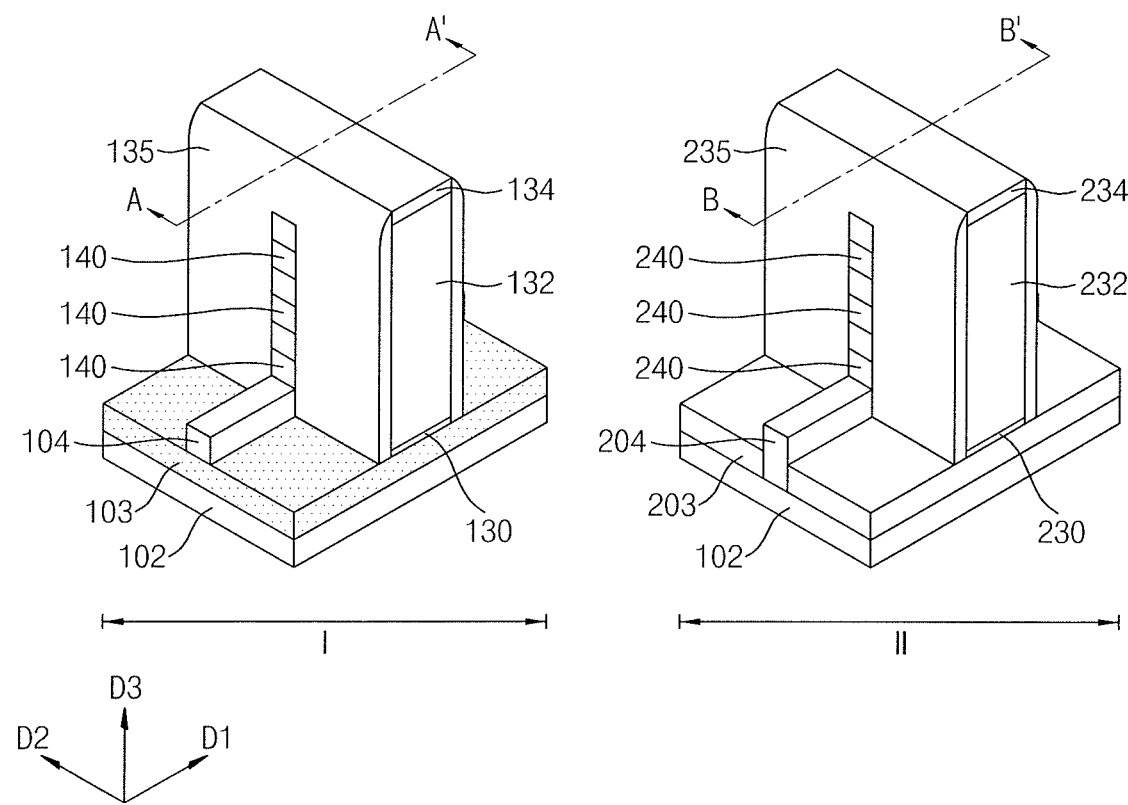
Figure 27B:
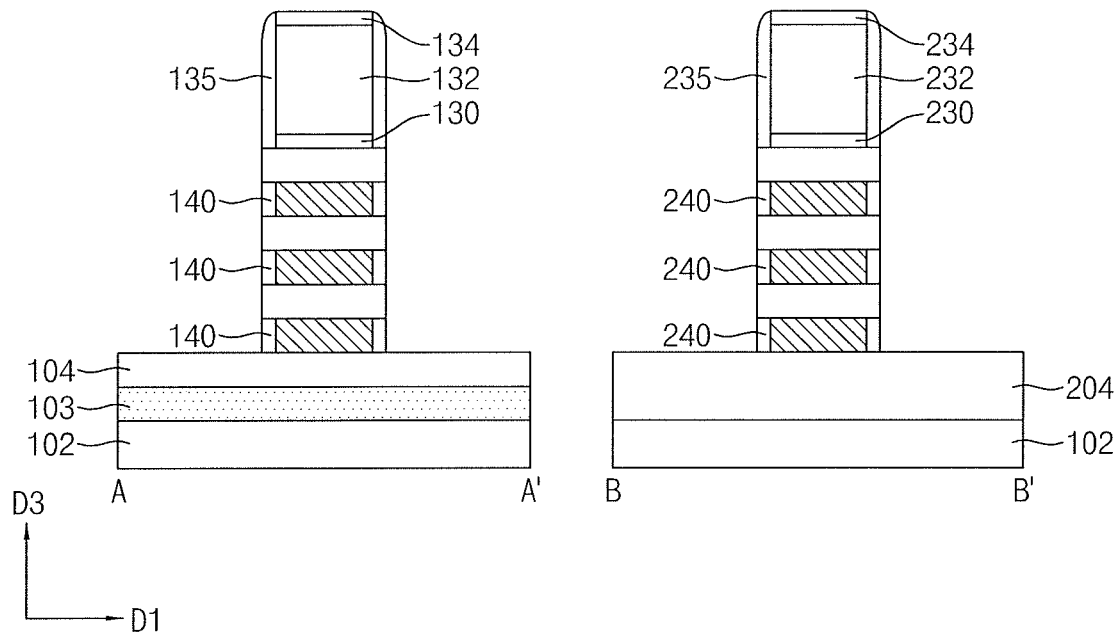

Referring to FIGS. 27A and 27B, a plurality of inner spacers 140 and 240 may be formed such that the plurality of recesses 140R and 240R may be filled with the plurality of inner spacers 140 and 240.

The inner spacers 140 and 240 may be formed of materials with excellent gap-filling capability. The inner spacers 140 may also be formed on the second semiconductor layer 104 and the gate spacer 135. The inner spacers 240 may also be formed on the base layer 204 and the gate spacer 235.

The plurality of inner spacers 140 and 240 may be disposed between the first channel layers 112, 114, and 116 and between the second channel layers 212, 214, and 216. The inner spacer 140 may be disposed between the second semiconductor layer 104 and the first channel layer 112, and the inner spacer 240 may also be disposed between the base layer 204 and the second channel layer 212. Outer surfaces of the inner spacers 140 and 240 may be located coplanar with the outer surfaces of the first channel layers 112, 114, and 116 and the outer surfaces of the second channel layers 212, 214, and 216.

Figure 28A:
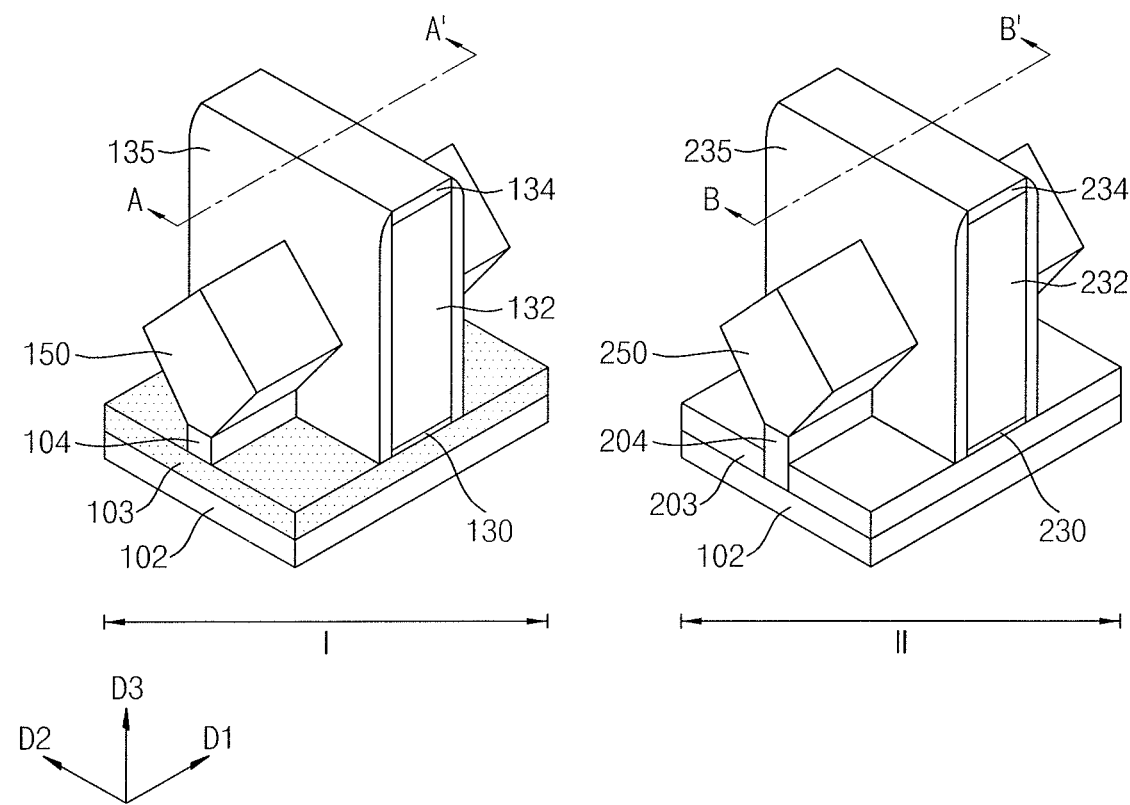
Figure 28B:
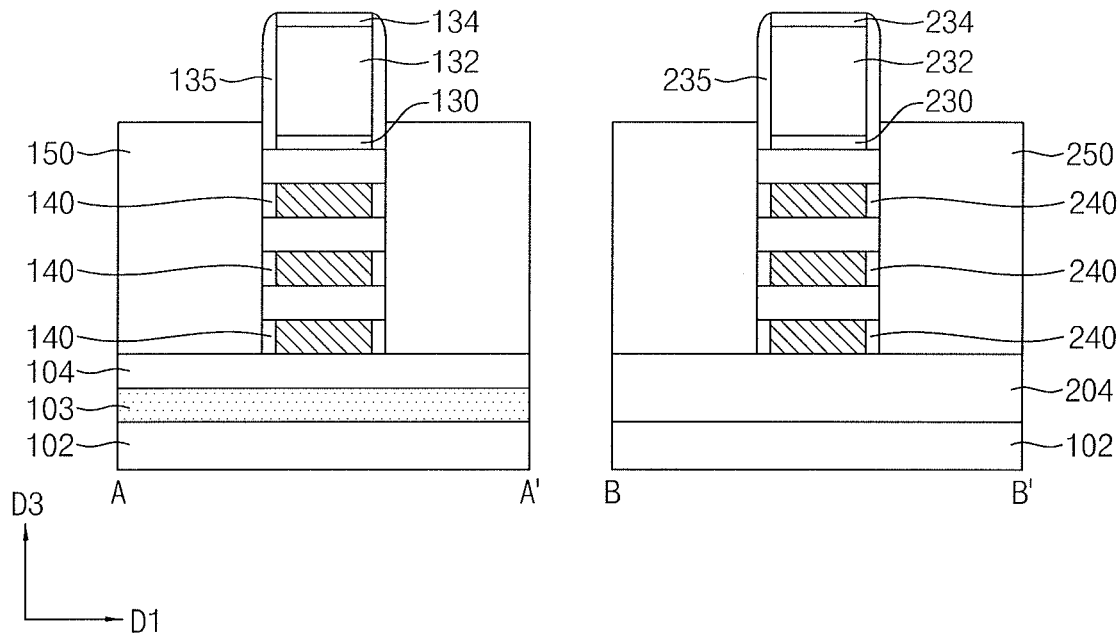

Referring to FIGS. 28A and 28B, the source/drain regions 150 and 250 may be formed on upper portions of the second semiconductor layer 104 and the base layer 204. The source/drain region 150 or 250 may be formed on both of the sides of the dummy gate structure. For example, the source/drain region 150 or 250 may be located on an outer surface of the gate spacer 135 or 235. The source/drain regions 150 and 250 may be formed by SEG. The source/drain regions 150 and 250 may be doped with suitable ions according to types of transistors.

For example, a fin used as the source/drain region 250 of a PMOS transistor may be doped with a p-type impurity. Boron (B), gallium (Ga), or the like may be used as the p-type impurity. A fin used as the source/drain region 150 of an NMOS transistor may be doped with an n-type impurity. Phosphorus (P), arsenic (As), or the like may be used as the n-type impurity.

The source/drain regions 150 and 250 may have different growth according to a crystallographic orientation and may have pentagonal cross sections. However, embodiments are not limited thereto, and the source/drain regions 150 and 250 may have, e.g., a diamond shape, a circular shape, a rectangular shape, a hexagonal shape, or the like.

Figure 29A:
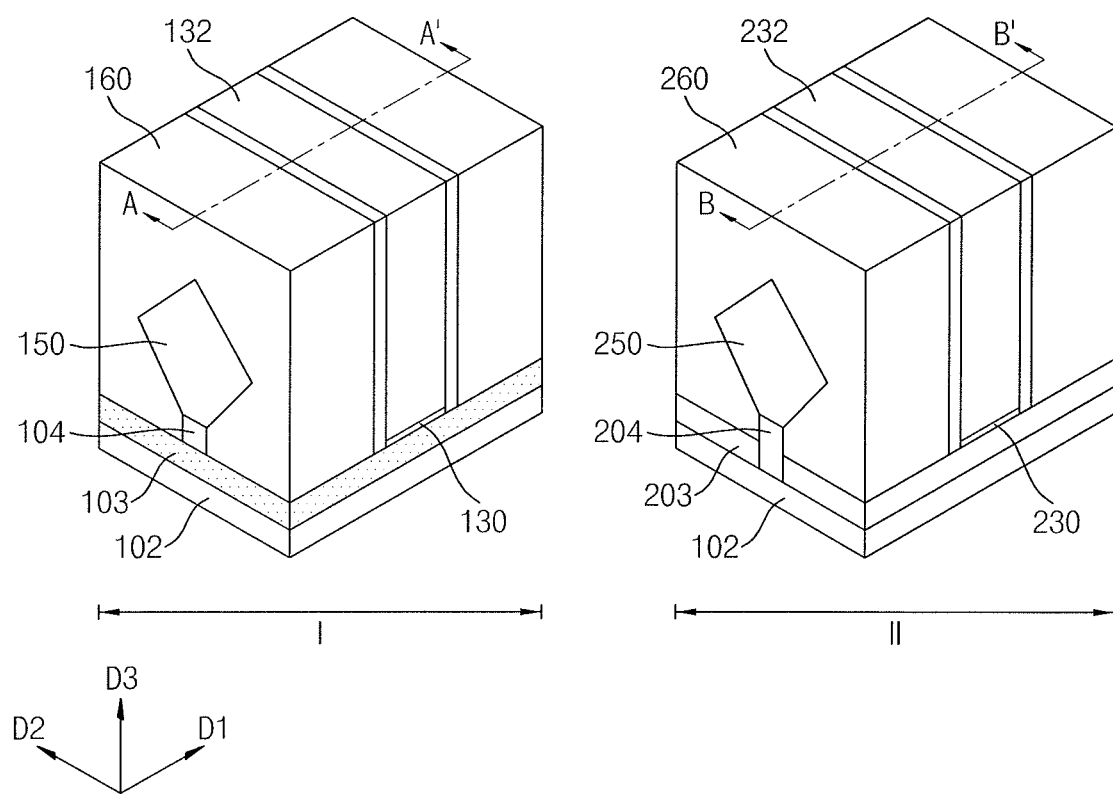
Figure 29B:
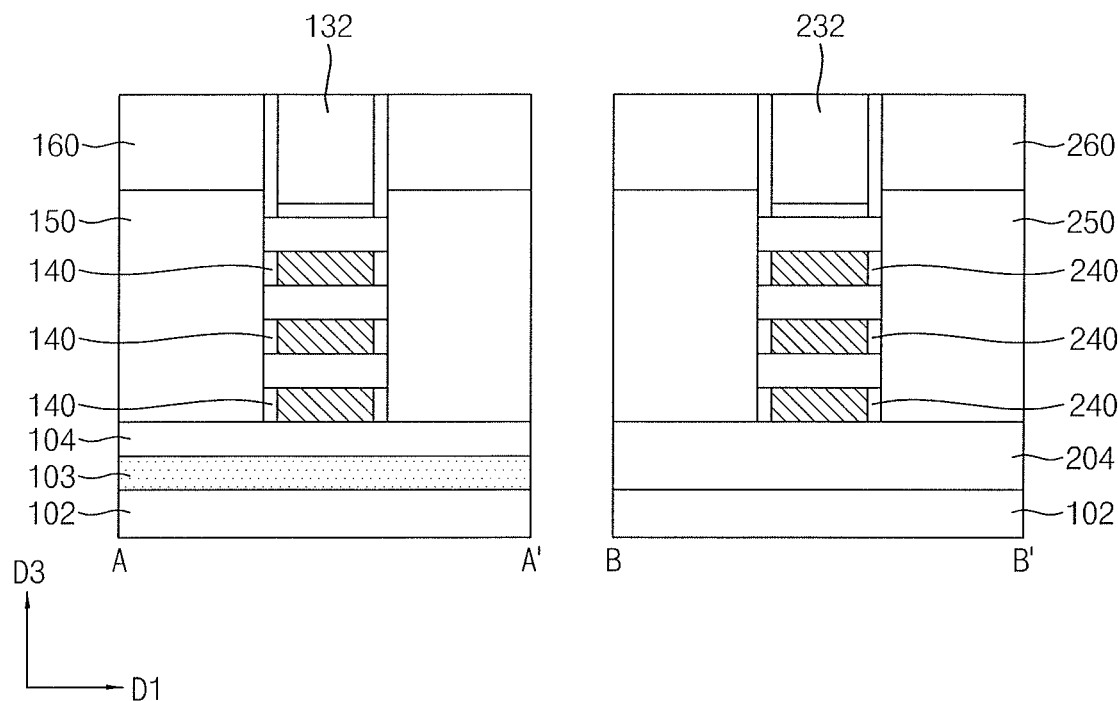

Referring to FIGS. 29A and 29B, the interlayer insulating layers 160 and 260 may be formed on the source/drain regions 150 and 250. The interlayer insulating layers 160 and 260 may entirely cover the side surfaces of the gate spacers 135 and 235, and the source/drain regions 150 and 250. The interlayer insulating layers 160 and 260 may each include, e.g., silicon oxide, silicon nitride, silicon oxynitride, PSG, BPSG, a low-k dielectric material, and/or one among differently applicable dielectric materials, or a multiple layer made of a plurality of layers. In an example embodiment, the interlayer insulating layers 160 and 260 may include silicon oxide. The interlayer insulating layers 160 and 260 may be formed by CVD, physical vapor deposition (PVD), ALD, spin-on coating, or the like. After the interlayer insulating layers 160 and 260 are formed, upper portions of the interlayer insulating layers 160 and 260 may be partially removed together with the dummy capping layers 134 and 234, and the dummy gate electrodes 132 and 232 may be exposed.

Figure 30A:
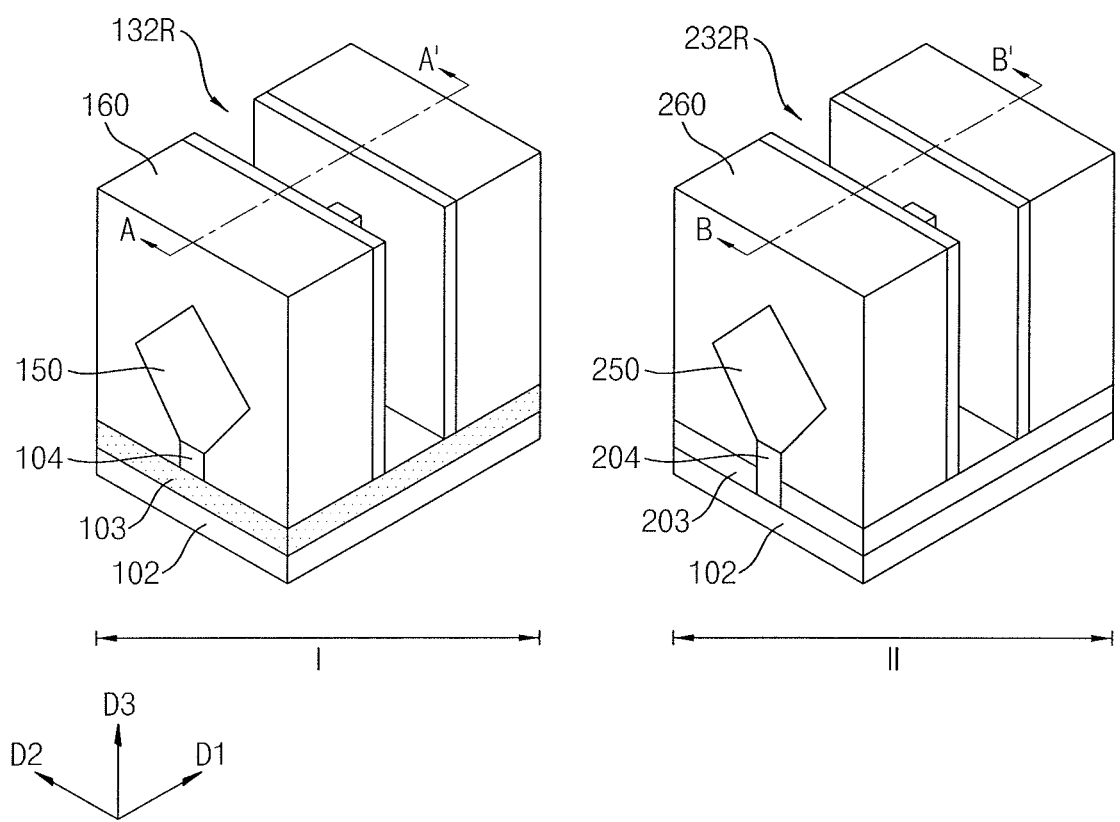
Figure 30B:
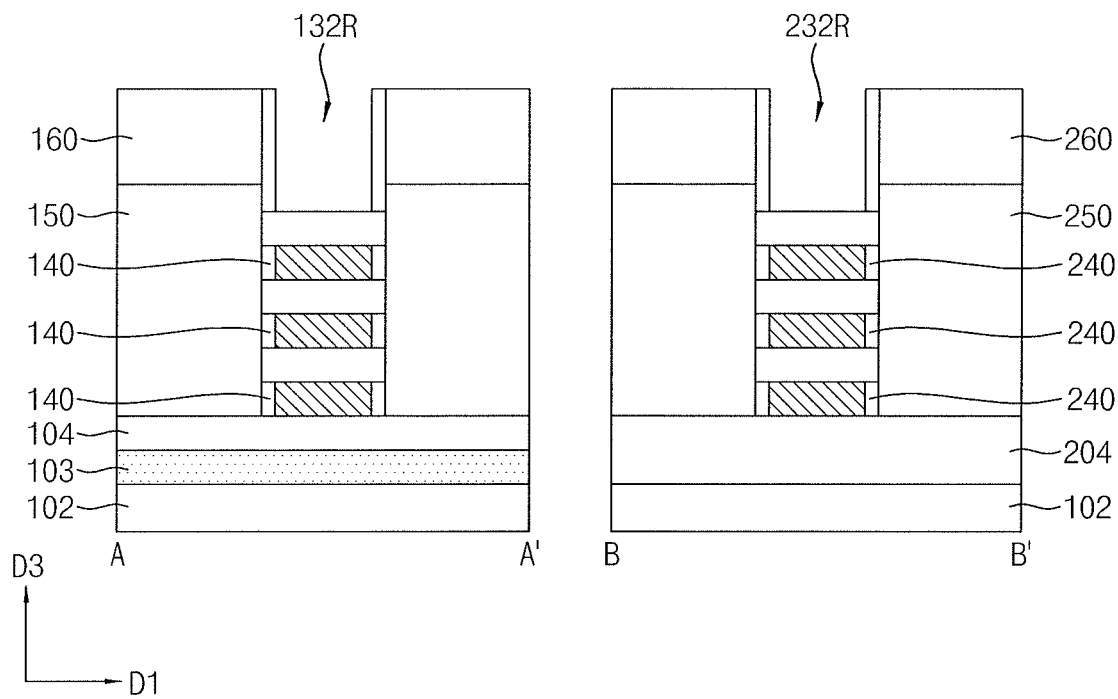

Referring to FIGS. 30A and 30B, the dummy gate electrodes 132 and 232 may be removed to form recesses 132R and 232R. For example, the dummy gate electrodes 132 and 232 may be removed by dry etching. A gas, e.g., Cl$_2$, HBr, SF$_6$, or CF$_4$, may be used for etching.

Figure 31:
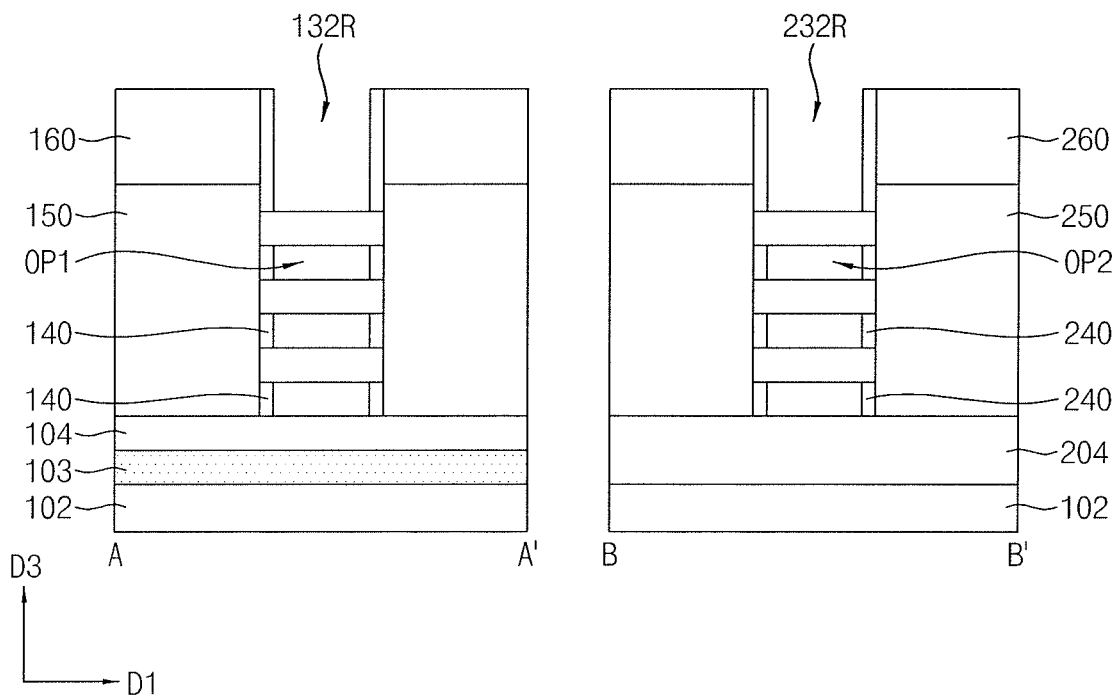

Referring to FIG. 31, the dummy gate insulating layers 130 and 230, the sacrificial layers 111, 113, and 115 of the first stack 110, and the sacrificial layers 211, 213, and 215 of the second stack 210 may be removed to form openings OP1 and OP2. The sacrificial layers 111, 113, 115, 211, 213, and 215 having an etch selectivity with respect to the first channel layers 112, 114, and 116 and the second channel layers 212, 214, and 216 may be removed by selective etching. The inner spacers 140 and 240 may prevent the source/drain regions 150 and 250 from being etched.

Referring to FIGS. 1 to 3, the gate electrode 170 and the gate dielectric layer 172 may be formed in the recess 132R and the opening OP1 of the first region I. The gate dielectric layer 172 may be conformally formed along the surfaces of the buried insulating layer 103, the second semiconductor layer 104, the first channel layers 112, 114, and 116, the gate spacer 135, and the inner spacer 140. The gate electrode 170 may be formed on the gate dielectric layer 172.

The gate electrode 270 and the gate dielectric layer 272 may be formed in the recess 232R and the opening OP2 of the second region II. The gate dielectric layer 272 may be conformally formed along the surfaces of the device isolation layer 203, the base layer 204, the second channel layer 212, 214, and 216, the gate spacer 235, and the inner spacer 240. The gate electrode 270 may be formed on the gate dielectric layer 272.

By way of summation and review, example embodiments are directed to providing a semiconductor device including a first channel layer and a second channel layer which have different crystallographic orientations. In addition, example embodiments are also directed to providing a method of manufacturing a semiconductor device including a first channel layer and a second channel layer which have different crystallographic orientations.

That is, according to the example embodiments, since a first channel layer and a second channel layer have different crystallographic orientations, e.g., silicon having a (100) orientation and silicon having a (110) orientation, a semiconductor device having a fast operating speed can be realized by optimizing carrier mobility, e.g., electrons and holes, in respective NMOS and PMOS transistors in accordance with the crystallographic orientations. In order to form a semiconductor device having a hybrid crystal orientation, a silicon on insulator (SOI) substrate having the hybrid crystal orientation may be used.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first semiconductor layer including a first region and a second region;
a plurality of first channel layers spaced apart from each other in a vertical direction on the first semiconductor layer in the first region;
a first gate electrode surrounding the plurality of first channel layers;
a plurality of second channel layers spaced apart from one another in the vertical direction on the first semiconductor layer in the second region; and
a second gate electrode surrounding the plurality of second channel layers,
wherein each of the plurality of first channel layers has a first crystallographic orientation, and each of the plurality of second channel layers has a second crystallographic orientation different from the first crystallographic orientation,
wherein the plurality of first channel layers include a first lowermost channel layer closest to the first semiconductor layer among the plurality of first channel layers,
wherein the plurality of second channel layers include a second lowermost channel layer closest to the first semiconductor layer among the plurality of second channel layers, and
wherein a level of a lower surface of the first lowermost channel layer is different from a level of a lower surface of the second lowermost channel layer.

2. The semiconductor device as claimed in claim 1, wherein the first crystallographic orientation is a (100) orientation, and the second crystallographic orientation is a (110) orientation.

3. The semiconductor device as claimed in claim 1, wherein a thickness of at least one of the plurality of second channel layers is different from a thickness of at least one of the plurality of first channel layers.

4. The semiconductor device as claimed in claim 1, wherein the plurality of second channel layers have different thicknesses.

5. The semiconductor device as claimed in claim 4, wherein:
the plurality of second channel layers include a first channel layer, a second channel layer, and a third channel layer in sequence on the first semiconductor layer in the second region, and
a thickness of the third channel layer is greater than a thickness of each of the first channel layer and the second channel layer.

6. The semiconductor device as claimed in claim 1, wherein a level of an upper surface of the first semiconductor layer in the first region is higher than a level of an upper surface of the first semiconductor layer in the second region.

7. The semiconductor device as claimed in claim 1, further comprising:
a buried insulating layer between the first semiconductor layer and the first gate electrode in the first region; and
a second semiconductor layer between the buried insulating layer and the first gate electrode in the first region.

8. The semiconductor device as claimed in claim 7, further comprising a base layer between the first semiconductor layer and the second gate electrode in the second region.

9. The semiconductor device as claimed in claim 8, wherein the second semiconductor layer has the first crystallographic orientation, and the base layer has the second crystallographic orientation.

10. The semiconductor device as claimed in claim 8, wherein a thickness of the base layer is greater than a thickness of the second semiconductor layer.

11. The semiconductor device as claimed in claim 10, wherein a level of an upper surface of the second semiconductor layer under the first gate electrode is different from a level of an upper surface of the base layer under the second gate electrode.

12. The semiconductor device as claimed in claim 1, wherein the plurality of first channel layers include a material different from a material of the plurality of second channel layers.

13. The semiconductor device as claimed in claim 1, wherein:
the plurality of first channel layers include at least one of Si, SiGe, InGaAs, InAs, GaSb, InSb, InP/InGaAs/InAs, GaAs/InP/InAs, GaAs/InGaAs/InAs, GaAs/InAlAs/InAs, InP/InGaAs/InP, GaAs/InAs, GaAs/InGaAs, and InP/InGaAs, and
the plurality of second channel layers include Si.

14. A semiconductor device, comprising:
a first semiconductor layer including a first region and a second region;
a plurality of first channel layers spaced apart from each other in a vertical direction on the first semiconductor layer in the first region;
a first gate electrode surrounding the plurality of first channel layers;
a plurality of second channel layers spaced apart from one another in the vertical direction on the first semiconductor layer in the second region; and
a second gate electrode surrounding the plurality of second channel layers,
wherein a crystallographic orientation of at least one of the plurality of first channel layers is different from a crystallographic orientation of at least one of the plurality of second channel layers, and
wherein the plurality of second channel layers have different thicknesses.

15. The semiconductor device as claimed in claim 14, wherein:
the plurality of second channel layers include a first channel layer, a second channel layer, and a third channel layer in sequence on the first semiconductor layer in the second region,
a thickness of the third channel layer is greater than a thickness of the second channel layer, and
the thickness of the second channel layer is greater than a thickness of the first channel layer.

16. The semiconductor device as claimed in claim 14, further comprising a source/drain region on opposite sides of each of the plurality of first channel layers, a lattice constant of the source/drain region being less than a lattice constant of silicon.

17. A semiconductor device, comprising:
a first semiconductor layer including a first region and a second region;
a buried insulating layer on the first semiconductor layer in the first region;
a second semiconductor layer on the buried insulating layer;
a base layer on the first semiconductor layer in the second region;
a plurality of first channel layers on the second semiconductor layer, the plurality of first channel layers being spaced apart from one another in a vertical direction;
a first gate electrode surrounding the plurality of first channel layers;
a plurality of second channel layers on the base layer, the plurality of second channel layers being spaced apart from one another in the vertical direction; and
a second gate electrode surrounding the plurality of second channel layers,
wherein the first semiconductor layer has a first crystallographic orientation, and the second semiconductor layer has a second crystallographic orientation different from the first crystallographic orientation, and
wherein the plurality of second channel layers have the first crystallographic orientation.

18. The semiconductor device as claimed in claim 17, wherein the base layer has the first crystallographic orientation.

19. The semiconductor device as claimed in claim 17, wherein a thickness of the base layer is greater than a thickness of each of the buried insulating layer and the second semiconductor layer.

* * * * *